(12) United States Patent
Zawodny et al.

(10) Patent No.: US 10,699,756 B2
(45) Date of Patent: **\*Jun. 30, 2020**

(54) APPARATUSES AND METHODS FOR PERFORMING CORNER TURN OPERATIONS USING SENSING CIRCUITRY

(71) Applicant: Micron Technology, Inc., Boise, ID (US)

(72) Inventors: Jason T. Zawodny, Eagle, ID (US); Sanjay Tiwari, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/215,122

(22) Filed: Dec. 10, 2018

(65) Prior Publication Data
US 2019/0108863 A1    Apr. 11, 2019

Related U.S. Application Data

(63) Continuation of application No. 15/133,986, filed on Apr. 20, 2016, now Pat. No. 10,153,008.

(51) Int. Cl.
*G11C 7/10* (2006.01)
*G11C 7/06* (2006.01)
(Continued)

(52) U.S. Cl.
CPC .......... *G11C 7/065* (2013.01); *G11C 8/10* (2013.01); *G11C 8/16* (2013.01); *G11C 15/043* (2013.01)

(58) Field of Classification Search
CPC ......... G11C 7/065; G11C 8/10; G11C 15/043; G11C 16/10; G11C 16/24; G11C 16/26;
(Continued)

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| EP | 0214718 | 3/1987 |

(Continued)

OTHER PUBLICATIONS

Warren Jr., Henry S., "Hacker's Delight", Second Edition, Oct. 2013, pp. 181-184 and 194.
(Continued)

*Primary Examiner* — Thong Q Le
(74) *Attorney, Agent, or Firm* — Brooks, Cameron & Huebsch, PLLC

(57) ABSTRACT

The present disclosure includes apparatuses and methods related to performing corner turn operations using sensing circuitry. An example apparatus comprises a first group of memory cells coupled to an access line and a plurality of sense lines and a second group of memory cells coupled to a plurality of access lines and one of the plurality of sense lines. The access line can be a same access line as one of the plurality of access lines. The example apparatus comprises a controller configured to cause a corner turn operation on an element stored in the first group of memory cells resulting in the element being stored in the second group of memory cells to be performed using sensing circuitry.

20 Claims, 12 Drawing Sheets

(51) Int. Cl.
*G11C 8/16* (2006.01)
*G11C 8/10* (2006.01)
*G11C 15/04* (2006.01)

(58) Field of Classification Search
CPC . G11C 2211/5641; G11C 7/10; G11C 7/1006;
G11C 8/06; G11C 8/16; G11C 2207/005;
G11C 7/1012; G11C 7/1036; G11C 7/22;
G11C 7/005; G11C 7/14
USPC ............ 365/185.03, 189.05, 185.11, 185.19,
365/185.2, 189.011, 145, 185.12, 189.08,
365/63, 103, 104, 148, 163
See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,852,065 A | 7/1989 | Baddiley | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,079,739 A | 1/1992 | Petersen | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,406,525 A | 4/1995 | Nicholes | |
| 5,430,687 A | 7/1995 | Hung et al. | |
| 5,440,482 A | 8/1995 | Davis | |
| 5,446,690 A | 8/1995 | Tanaka et al. | |
| 5,449,907 A | 9/1995 | McKeeman et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,606,707 A | 2/1997 | Tomassi et al. | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,740,340 A | 4/1998 | Purcell et al. | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,953,738 A | 9/1999 | Rao | |
| 5,954,831 A | 9/1999 | Chang | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Nail | |
| 6,389,507 B1 | 5/2002 | Sherman | |
| 6,411,333 B1 | 6/2002 | Auld et al. | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth et al. | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,058,880 B1 | 6/2006 | Ding et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,532,529 B2 | 5/2009 | Dadashev et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,907,473 B2 | 3/2011 | Ishizaki et al. | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |

(56) References Cited

U.S. PATENT DOCUMENTS

| | | |
|---|---|---|
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,437,217 B2 | 5/2013 | Pekny |
| 8,447,962 B2 | 5/2013 | Hughes et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,688,962 B2 | 4/2014 | Raikin et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 10,153,008 B2 * | 12/2018 | Zawodny ............... G11C 7/065 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0036801 A1 | 2/2006 | Jones et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0241405 A1 | 10/2007 | Popoff |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Lou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0040596 A1 | 2/2014 | Fleischer et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0085589 A1 | 3/2015 | Lu et al. |
| 2015/0089166 A1 | 3/2015 | Kogge |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |

(56) References Cited

U.S. PATENT DOCUMENTS

| | | |
|---|---|---|
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2017/0243623 A1 | 8/2017 | Kirsch |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).

* cited by examiner

| | COMP_COMP (531) | ELEM_SPAN (533) | TMP_SHIFTED (535) | E (537) | VECTOR_BLOCK (539) | DEST (541) |
|---|---|---|---|---|---|---|
| 551-i | 0X00,00,00,00 | 0X00,00,00,00 | 0X00,00,00,00 | 0X0 | 0X00 | ROW 0: 0XFF,00,00,00<br>ROW 1: 0XF0,00,00,00<br>ROW 2: 0XCC,00,00,00<br>ROW 3: 0XAA,00,00,00<br>ROW 4: 0X00,00,00,00<br>ROW 5: 0X0F,00,00,00<br>ROW 6: 0X33,00,00,00<br>ROW 7: 0X55,00,00,00 |
| 551-ii | 0X00,FF,FF,FF | 0X00,FF,FF,FF | 0X00,00,00,00 | 0X0 | 0X00 | UNCHANGED |
| 551-iii | 0X00,00,00,20 | 0X00,FF,FF,FF | 0X00,00,00,00 | 0X8 | 0X00 | UNCHANGED |
| 553 | 0X00,00,00,20 | 0X00,FF,FF,FF | 0X00,00,00,00 | 0X8 | 0X00 | UNCHANGED |
| 553-1a | 0XF7 | 0X00,FF,FF,FF | 0X00,00,00,00 | 0X8 | 0XF7 | UNCHANGED |
| 553-1b | 0X00,00,00,00 | 0X00,FF,FF,FF | 0X00,00,00,00 | 0X8 | 0XF7 | ROW 0: 0XFF,00,00,00<br>ROW 1: 0XF0,00,00,00<br>ROW 2: 0XCC,00,00,00<br>ROW 3: 0XAA,00,00,00<br>ROW 4: 0X00,00,00,00<br>ROW 5: 0X0F,00,00,00<br>ROW 6: 0X33,00,00,00<br>ROW 7: 0X55,00,00,00 |
| 553-1c | 0X4 | 0X00,FF,FF,FF | 0X00,00,00,00 | 0X4 | 0XF7 | UNCHANGED |
| 553-1d | 0X0F,00,00,0F | 0X0F,00,00,0F | 0X00,00,00,00 | 0X4 | 0XF7 | UNCHANGED |
| 553-2a | 0XFB | 0X0F,00,00,0F | 0X00,00,00,00 | 0X4 | 0XFB | UNCHANGED |
| 553-2b | 0X00,00,00,00 | 0X0F,00,00,0F | 0X00,00,00,00 | 0X4 | 0XFB | ROW 0: 0XF0,00,00,00<br>ROW 1: 0XF0,00,00,00<br>ROW 2: 0XC3,00,00,00<br>ROW 3: 0XA5,00,00,00<br>ROW 4: 0XF0,00,00,00<br>ROW 5: 0X0F,00,00,00<br>ROW 6: 0XC3,00,00,00<br>ROW 7: 0XA5,00,00,00 |

| | | | | | | |
|---|---|---|---|---|---|---|
| 553-2c | 0X2 | 0X0F,00,00,0F | 0X00,00,00,00 | 0X2 | 0XFB | UNCHANGED |
| 553-2d | 0X33,00,00,33 | 0X33,00,00,33 | 0X00,00,00,00 | 0X2 | 0XFB | UNCHANGED |
| 553-3a | 0XFD | 0X33,00,00,33 | 0X00,00,00,00 | 0X2 | 0XFD | UNCHANGED |
| 553-3b | 0X00,00,00,00 | 0X33,00,00,33 | 0X00,00,00,00 | 0X2 | 0XFD | ROW 0: 0XF0,00,00,00<br>ROW 1: 0XE1,00,00,00<br>ROW 2: 0XC3,00,00,00<br>ROW 3: 0XE1,00,00,00<br>ROW 4: 0XF0,00,00,00<br>ROW 5: 0X2D,00,00,00<br>ROW 6: 0XC3,00,00,00<br>ROW 7: 0X2D,00,00,00 |
| 553-3c | 0X1 | 0X33,00,00,33 | 0X00,00,00,00 | 0X1 | 0XFD | UNCHANGED |
| 553-3d | 0X55,00,00,55 | 0X55,00,00,55 | 0X00,00,00,00 | 0X1 | 0XFD | UNCHANGED |
| 553-4a | 0XFE | 0X55,00,00,55 | 0X00,00,00,00 | 0X1 | 0XFE | UNCHANGED |
| 553-4b | 0X00,00,00,00 | 0X55,00,00,55 | 0X00,00,00,00 | 0X1 | 0XFE | ROW 0: 0XF0,00,00,00<br>ROW 1: 0XE1,00,00,00<br>ROW 2: 0XD2,00,00,00<br>ROW 3: 0XC3,00,00,00<br>ROW 4: 0XB4,00,00,00<br>ROW 5: 0XA5,00,00,00<br>ROW 6: 0X96,00,00,00<br>ROW 7: 0X87,00,00,00 |
| 553-4c | 0X0 | 0X55,00,00,55 | 0X00,00,00,00 | 0X0 | 0XFE | UNCHANGED |
| 553-4d | 0X00,00,00,00 | 0X00,00,00,00 | 0X00,00,00,00 | 0X0 | 0XFE | UNCHANGED |

*Fig. 5 (CONT)*

| | COMP_COMP | ELEM_SPAN | TMP_SHIFTED | E | R | VECTOR_BLOCK | DEST |
|---|---|---|---|---|---|---|---|
| 653-2b.0.i | 0X00,00,00,00 | 0X0F,00,00,0F | 0X00,00,00,00 | 0X4 | 0X00 | 0XFB | ROW 0: 0XFF,00,00,00<br>ROW 1: 0XF0,00,00,00<br>ROW 2: 0XCC,00,00,00<br>ROW 3: 0XAA,00,00,00<br>ROW 4: 0X00,00,00,00<br>ROW 5: 0X0F,00,00,00<br>ROW 6: 0X33,00,00,00<br>ROW 7: 0X55,00,00,00 |
| 653-2b.0.ii | 0X00,00,00,00 | 0X0F,00,00,0F | 0X00,00,00,00 | 0X4 | 0X00 | 0XFB | UNCHANGED |
| 653-2b.0.iii | 0XFF,00,00,00 | 0X0F,00,00,0F | 0X00,00,00,00 | 0X4 | 0X00 | 0XFB | UNCHANGED |
| 653-2b.0.iv | 0X0F,00,00,00 | 0X0F,00,00,0F | 0X00,00,00,00 | 0X4 | 0X00 | 0XFB | UNCHANGED |
| 653-2b.0.v | 0X0F,00,00,00 | 0X0F,00,00,0F | 0X0F,00,00,00 | 0X4 | 0X00 | 0XFB | UNCHANGED |
| 653-2b.0.vi | 0XF0,00,00,00 | 0X0F,00,00,0F | 0X0F,00,00,00 | 0X4 | 0X00 | 0XFB | ROW 0: 0XF0,00,00,00<br>ROW 1: 0XF0,00,00,00<br>ROW 2: 0XCC,00,00,00<br>ROW 3: 0XAA,00,00,00<br>ROW 4: 0X00,00,00,00<br>ROW 5: 0X0F,00,00,00<br>ROW 6: 0X33,00,00,00<br>ROW 7: 0X55,00,00,00 |
| 653-2b.0.vii | | | | | | | |

| FIGURE 6A | | | | | |
|---|---|---|---|---|---|
| 653-2b.0.viii | 0X0F,00,00,00 | 0X0F,00,00,0F | 0X0F,00,00,00 | 0X4 | 0X00 | UNCHANGED |
| 653-2b.0.ix | 0XF0,00,00,00 | 0X0F,00,00,0F | 0X0F,00,00,00 | 0X4 | 0X00 | 0XFB | UNCHANGED |
| 653-2b.0.x | 0XF0,00,00,00 | 0X0F,00,00,0F | 0X0F,00,00,00 | 0X4 | 0X00 | 0XFB | UNCHANGED |
| | 0XF0,00,00,00 | 0X0F,00,00,0F | | | 0X00 | 0XFB | ROW 0: 0XF0,00,00,00<br>ROW 1: 0XF0,00,00,00<br>ROW 2: 0XCC,00,00,00<br>ROW 3: 0XAA,00,00,00<br>ROW 4: 0XF0,00,00,00<br>ROW 5: 0X0F,00,00,00<br>ROW 6: 0X33,00,00,00<br>ROW 7: 0X55,00,00,00 |
| 653-2b.0.xi | | 0X0F,00,00,0F | 0X0F,00,00,00 | 0X4 | 0X01 | |
| 653-2b.0.xii | 0X01 | | | | | 0XFB |

*Fig. 6A (CONT)*

| | 645 | 653-2 | 653-2b.0 | 653-2b.1 | 653-2b.2 | 653-2b.3 |
|---|---|---|---|---|---|---|
| 641 | ROW 0 | 0XFF,00,00,00 | 0XF0,00,00,00 | 0XF0,00,00,00 | 0XF0,00,00,00 | 0XF0,00,00,00 |
| | ROW 1 | 0XF0,00,00,00 | 0XF0,00,00,00 | 0XF0,00,00,00 | 0XF0,00,00,00 | 0XF0,00,00,00 |
| | ROW 2 | 0XCC,00,00,00 | 0XCC,00,00,00 | 0XCC,00,00,00 | 0XC3,00,00,00 | 0XC3,00,00,00 |
| | ROW 3 | 0XAA,00,00,00 | 0XAA,00,00,00 | 0XAA,00,00,00 | 0XAA,00,00,00 | 0XA5,00,00,00 |
| | ROW 4 | 0X00,00,00,00 | 0XF0,00,00,00 | 0XF0,00,00,00 | 0XF0,00,00,00 | 0XF0,00,00,00 |
| | ROW 5 | 0X0F,00,00,00 | 0X0F,00,00,00 | 0X0F,00,00,00 | 0X0F,00,00,00 | 0X0F,00,00,00 |
| | ROW 6 | 0X33,00,00,00 | 0X33,00,00,00 | 0X33,00,00,00 | 0XC3,00,00,00 | 0XC3,00,00,00 |
| | ROW 7 | 0X55,00,00,00 | 0X55,00,00,00 | 0X55,00,00,00 | 0X55,00,00,00 | 0XA5,00,00,00 |
| 643 | r = | 0 | 1 | 2 | 3 | 8 |

*Fig. 6B*

TABLE 7-1

| A (744) | B (745) | NOT OPEN (756) | OPEN TRUE (770) | OPEN INVERT (771) |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

775

TABLE 7-2

| | | | | | | | | | | |
|---|---|---|---|---|---|---|---|---|---|---|
| | FF | 0 | 0 | 0 | 0 | 0 | 0 | 1 | 1 | 1 | ← 776 |
| | FT | 0 | 0 | 0 | 1 | 1 | 1 | 0 | 0 | 0 | ← 777 |
| | TF | 0 | 0 | 1 | 0 | 0 | 1 | 0 | 0 | 1 | ← 778 |
| | TT | 0 | 1 | 0 | 0 | 1 | 0 | 0 | 1 | 0 | ← 779 |
| A | B | A | A*B | A*$\bar{B}$ | A+B | B | AXB | A+$\bar{B}$ | $\overline{AXB}$ | $\bar{B}$ | ← 747 |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

776, 777, 778, 779 } 780

APPARATUSES AND METHODS FOR PERFORMING CORNER TURN OPERATIONS USING SENSING CIRCUITRY

PRIORITY INFORMATION

This application is a Continuation of U.S. application Ser. No. 15/133,986, filed Apr. 20, 2016, which issues as U.S. Pat. No. 10,153,008 on Dec. 11, 2018, the contents of which are included herein by reference.

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in an electronic system may be involved in providing instructions to the functional unit circuitry for execution. The instructions may be generated, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing.

BRIEF DESCRIPTION OF THE DRAWINGS

FIG. 5 illustrates a table showing the state of memory cells of an array at a particular phase associated with performing corner turn operations in accordance with a number of embodiments of the present disclosure.

FIGS. 6A-6B each illustrate a table showing the state of memory cells of an array at a particular phase associated with performing corner turn operations in accordance with a number of embodiments of the present disclosure.

DETAILED DESCRIPTION

Figure 1:
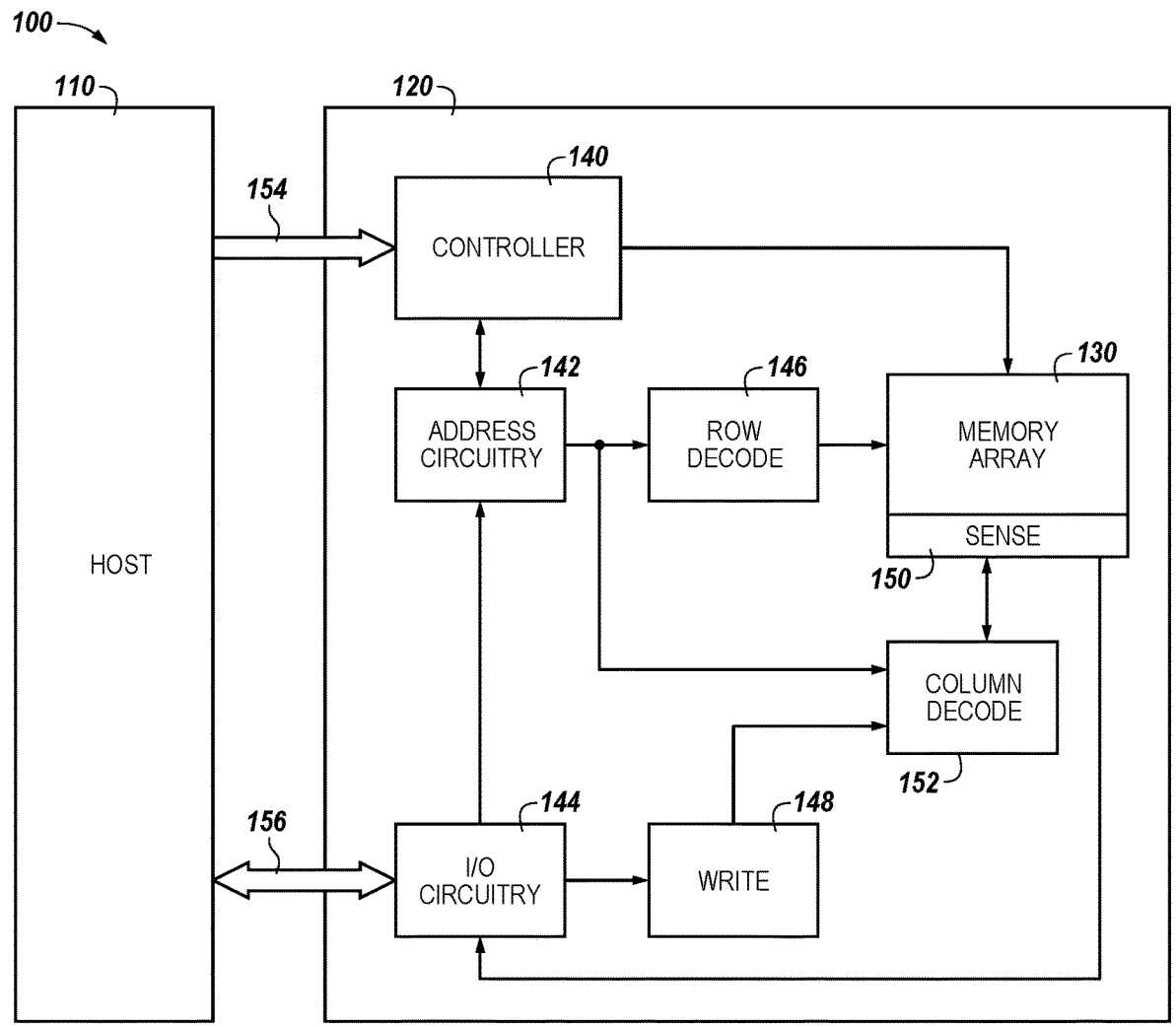
FIG. 1 is a block diagram of an apparatus in the form of a computing system including a memory device in accordance with a number of embodiments of the present disclosure.

An example apparatus comprises a first group of memory cells coupled to an access line and a plurality of sense lines and a second group of memory cells coupled to a plurality of access lines and one of the plurality of sense lines. The example apparatus comprises a controller configured to cause sensing circuitry to perform a corner turn operation on an element stored in the first group of memory cells resulting in the element being stored in the second group of memory cells.

According to various embodiments of the present disclosure, sensing circuitry is configured to perform a number of logical operations (e.g., AND operations, SHIFT operations, etc.) to perform the corner turn operation. The corner turn operation can include performing an in-place corner turn operation on a number of elements stored in memory cells of the array coupled to a plurality of access lines and a plurality of sense lines. For example, the number of elements can be stored in a horizontal fashion, as illustrated in the provided figures below, in the plurality of access lines and the plurality of sense lines prior to performing the corner turn operations. The corner turn operation can result in the number of elements being corner turned and stored back to the original memory cells in a different format. For example, a result of the corner turn operations can include the number of elements being stored in a vertical fashion, as illustrated below in the provided figures, in the same memory cells that originally stored the elements in the horizontal fashion. An element being stored in cells coupled to a single sense line (e.g., in a vertical fashion and/or format) can be beneficial when performing a number of PIM operations in accordance with embodiments of the present disclosure.

A number of embodiments of the present disclosure can provide improved parallelism and/or reduced power consumption in association with performing logical operations as compared to previous systems having an external processor (e.g., a processing resource located external from a memory array, such as on a separate integrated circuit chip). For instance, a number of embodiments can provide for performing fully complete logical operations such as integer add, subtract, multiply, divide, and CAM (content addressable memory) functions without transferring data out of the memory array and sensing circuitry via a bus (e.g., data bus, address bus, control bus), for instance. Such logical operations can involve performing a number of logical functions (e.g., logical functions such as AND, OR, NOT, NOR, NAND, XOR, etc.). However, embodiments are not limited to these examples. For instance, performing logical operations can include performing a number of non-Boolean logic operations such as sense amplifier set, sense amplifier clear, copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the circuitry to perform the compute function.

Some advantages of embodiments of the present disclosure over previous approaches can include capability for implementing a greater quantity of logical operations using a same circuit configuration, and increased flexibility in implementing a plurality of logical operations. Logical operations can be selected dynamically from among a number of possible logical operations. Capability to select a number of different logical operations to implement directly can result in faster operations with fewer manipulations and movements (e.g., storing intermediate results) of data. And direct implementation of a plurality of different logical operations can use less power to obtain a result due in part to less movement of intermediate results. Also, embodiments of the present disclosure can be used to directly implement XOR and XNOR logical operations (e.g., in a single operation), rather than by obtaining the result via one or more logical operations involving intermediate results.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example.

For example, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Furthermore, the circuitry of the processing resource(s) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. The data may be processed by a processing resource associated with a host, for instance, rather than on pitch with the memory.

In contrast, a number of embodiments of the present disclosure can include the sensing circuitry 150 (e.g., including sense amplifiers and/or compute components) being formed on pitch with the memory cells of the array. The sensing circuitry 150 can be configured for (e.g., capable of) performing logical operations. A number of embodiments of the present disclosure include sensing circuitry formed on pitch with memory cells of the array and capable of performing logical functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 406 in FIG. 4. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, a controller 140, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals may also be received to controller 140 (e.g., via address circuitry 142 and/or via bus 154). Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of control circuitry. Controller 140 can be implemented in hardware, firmware, and/or software. Controller 140 can also control shifting circuitry, which can be implemented, for example, in the sensing circuitry 150 according to various embodiments.

Examples of the sensing circuitry 150 are described further below. For instance, in a number of embodiments, the sensing circuitry 150 can comprise a number of sense amplifiers (e.g., sense amplifier shown as 206 in FIG. 2, 306 in FIG. 3, and/or 406 in FIG. 4) and a number of compute components (e.g., compute component shown as 231 in FIG. 2, 331 in FIG. 3, and/or 431 in FIG. 4), which can be used to perform logical operations (e.g., such as corner turn operations on data associated with complementary data lines). The sense amplifier can comprise a static latch, for example, which can be referred to herein as the primary latch. The compute component 231 can comprise a dynamic and/or static latch, for example, which can be referred to herein as the secondary latch, and which can serve as, and be referred to as, an accumulator.

In a number of embodiments, the sensing circuitry (e.g., 150) can be used to perform logical operations (e.g., corner turn operations) using data stored in array 130 as inputs and store the results of the logical operations back to the array 130 without transferring data via a sense line address access (e.g., without firing a column decode signal). As such, various logical functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform logical functions using the operands, and the result would be transferred back to the array (e.g., 130) via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, various circuitry external to array 130 and sensing circuitry 150 (e.g., external registers associated with an ALU) is not needed to perform logical functions as the sensing circuitry 150 can perform the appropriate logical operations to perform such logical functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
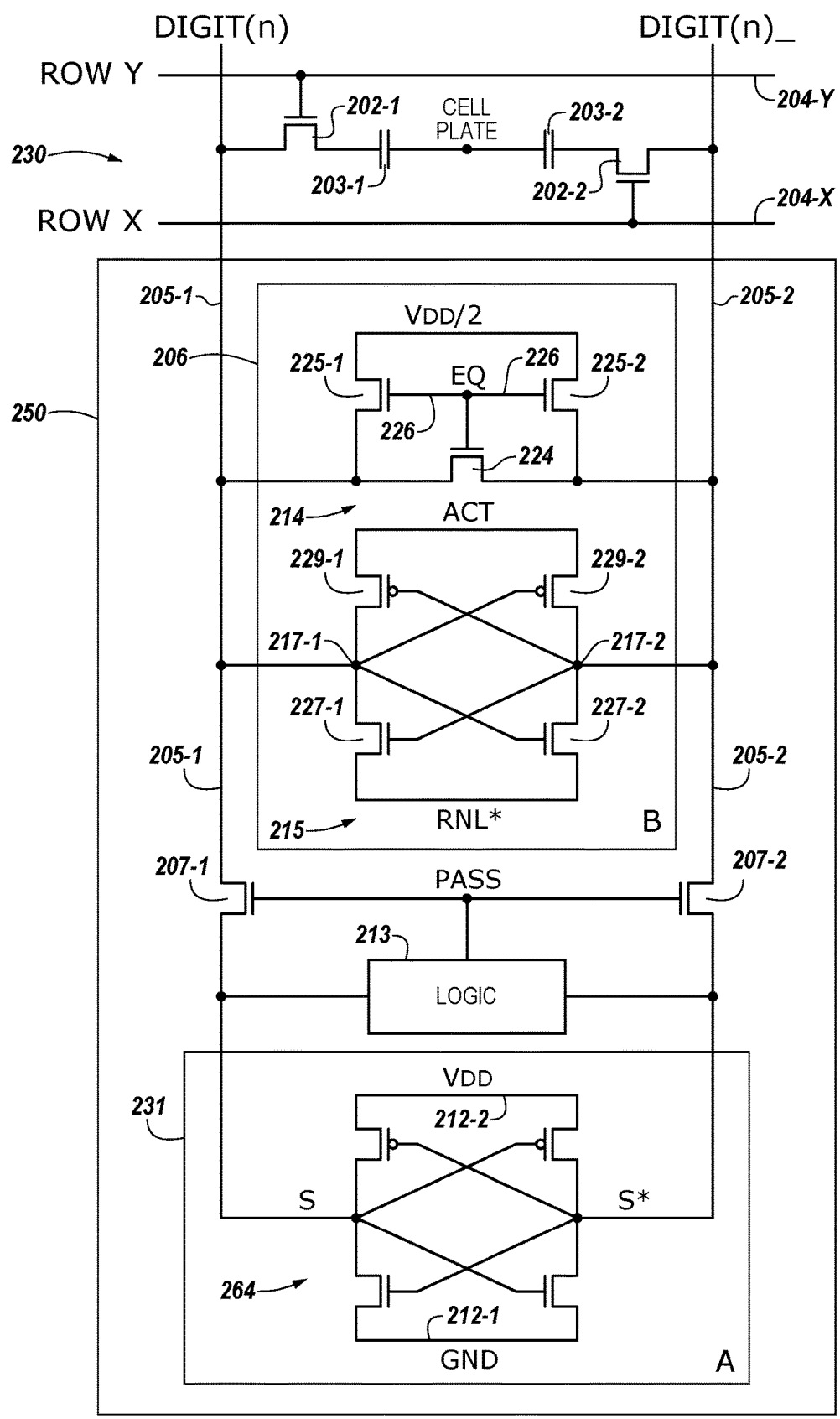
FIG. 2 is a schematic diagram illustrating sensing circuitry in accordance with a number of embodiments of the present disclosure.

FIG. 2 is a schematic diagram illustrating sensing circuitry in accordance with a number of embodiments of the present disclosure. A memory cell comprises a storage element (e.g., capacitor) and an access device (e.g., transistor). For instance, transistor 202-1 and capacitor 203-1 comprise a memory cell, and transistor 202-2 and capacitor 203-2 comprise a memory cell, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (ROW X), 204-Y (ROW Y), etc., and columns coupled by pairs of complementary sense lines (e.g., data lines DIGIT(n)/DIGIT(n)_). The individual sense lines corresponding to each pair of complementary sense lines can also be referred to as data lines 205-1 (D) and 205-2 (D_) respectively. Although only one pair of complementary data lines (e.g., one column) are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sensing circuitry 250 can correspond to sensing circuitry 150 shown in FIG. 1, for example. The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines 205-1 and 205-2 un-transposed between the sense amplifier 206 and the compute component 231 (as shown in FIG. 2) and/or swap gate logic for controlling swap gates that couple the pair of complementary sense lines transposed between the sense amplifier 206 and the compute component 231 (as is discussed later with respect to FIGS. 11, 12, 14, and 15, for example). The logical operation selection logic 213 can also be coupled to the pair of complementary sense lines 205-1 and 205-2. The logical operation selection logic 213 can be configured to control pass gates 207-1 and 207-2 (e.g., to control whether the pass gates 207-1 and 207-2 are in a conducting state or a non-conducting state) based on a selected logical operation, as described in detail below for various configurations of the logical operation selection logic 213.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to the pair of complementary data lines 205-1 and 205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2).

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal can be driven high and the RNL* signal can be driven low to enable (e.g., fire) the sense amplifier 206. The data line 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{DD}$ (e.g., through a source transistor (not shown)), and the other data line 205-1 (D) or 205-2 (D_) is driven to the voltage of the reference voltage (e.g., to ground (GND) through a sink transistor (not shown)). Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations associated therewith using less power than various previous approaches. Additionally, since a number of embodiments can eliminate the need to transfer data across I/O lines in order to perform logical functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{DD}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logical functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

As shown in FIG. 2, the compute component 231 can also comprise a latch 264, which can be referred to herein as a secondary latch. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

Figure 3:
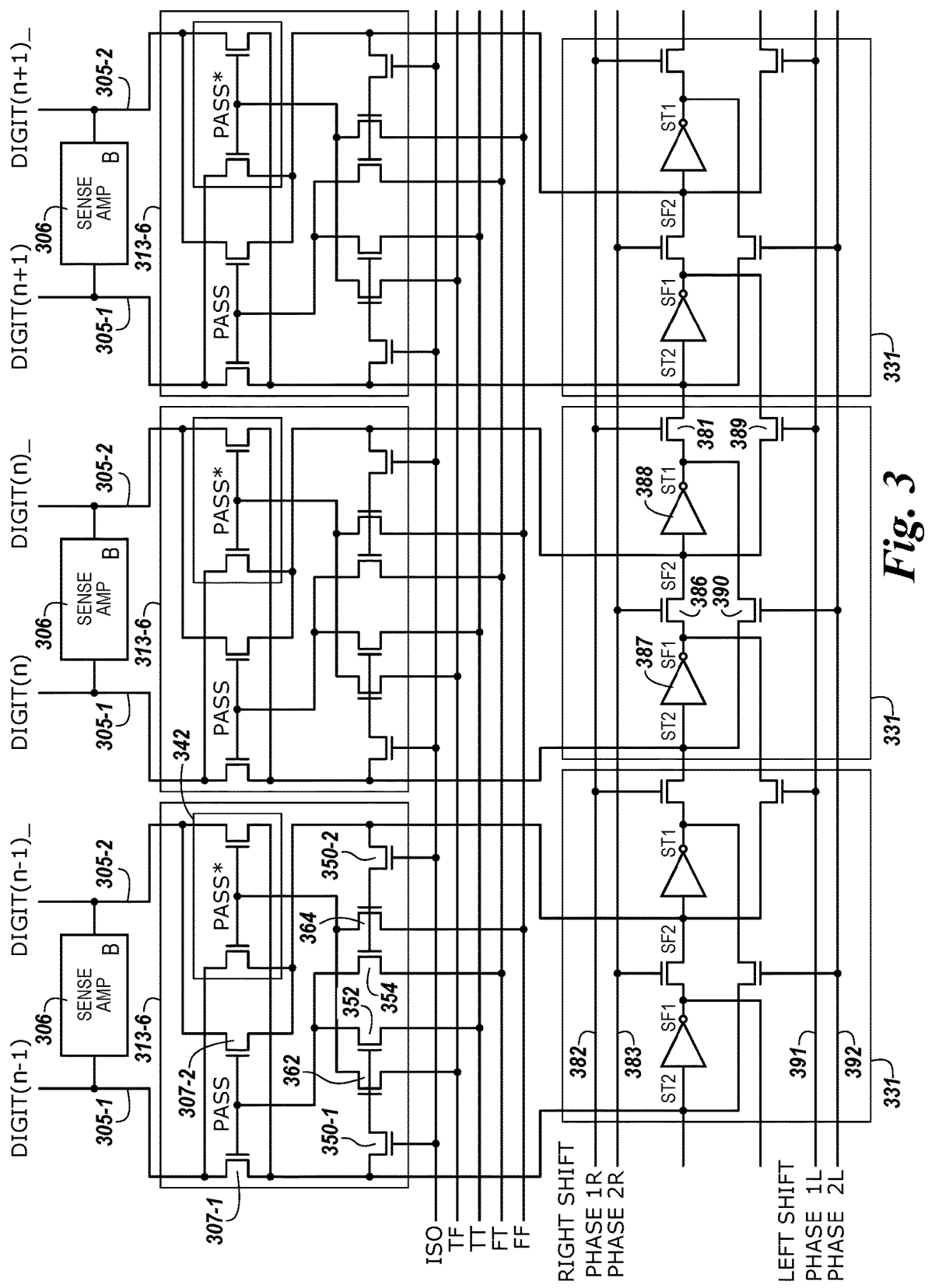
FIG. 3 is a schematic diagram illustrating sensing circuitry having selectable logical operation selection logic in accordance with a number of embodiments of the present disclosure.

FIG. 3 is a schematic diagram illustrating sensing circuitry having selectable logical operation selection logic in accordance with a number of embodiments of the present disclosure. FIG. 3 shows a number of sense amplifiers 306 coupled to respective pairs of complementary sense lines 305-1 and 305-2, and a corresponding number of compute component 331 coupled to the sense amplifiers 306 via pass gates 307-1 and 307-2. The gates of the pass gates 307-1 and 307-2 can be controlled by a logical operation selection logic signal, PASS. For example, an output of the logical operation selection logic 313-6 can be coupled to the gates of the pass gates 307-1 and 307-2.

According to the embodiment illustrated in FIG. 3, the compute components 331 can comprise respective stages (e.g., shift cells) of a loadable shift register configured to shift data values left and right. According to some embodiments, the compute component 331 can have bidirectional shift capabilities. According to various embodiments of the present disclosure, the compute components 331 can comprise a loadable shift register (e.g., with each compute component 331 serving as a respective shift stage) configured to shift in multiple directions (e.g., right and left). According to various embodiments of the present disclosure, the compute components 331 can comprise respective stages (e.g., shift cells) of a loadable shift register configured to shift in one direction. The loadable shift register can be coupled to the pairs of complementary sense lines 305-1 and 305-2, with node ST2 of each stage being coupled to the sense line (e.g., DIGIT(n)) communicating a true data value and with node SF2 of each stage being coupled to the sense line (e.g., DIGIT(n)_) communicating a complementary (e.g., false) data value.

According to some embodiments and as illustrated in FIG. 3, each compute component 331 (e.g., stage) of the shift register comprises a pair of right-shift transistors 381 and 386, a pair of left-shift transistors 389 and 390, and a pair of inverters 387 and 388. The signals PHASE 1R, PHASE 2R, PHASE 1L, and PHASE 2L can be applied to respective control lines 382, 383, 391 and 392 to enable/disable feedback on the latches of the corresponding compute components 331 in association with performing logical operations and/or shifting data in accordance with embodiments described herein. Examples of shifting data (e.g., from a particular compute component 331 to an adjacent compute component 331) is described further below with respect to FIGS. 8 and 9.

The compute components 331 (e.g., stages) of the loadable shift register can comprise a first right-shift transistor 381 having a gate coupled to a first right-shift control line 380 (e.g., "PHASE 1R"), and a second right-shift transistor 386 having a gate coupled to a second right-shift control line 382 (e.g., "PHASE 2R"). Node ST2 of each stage of the loadable shift register is coupled to an input of a first inverter 387. The output of the first inverter 387 (e.g., node SF1) is coupled to one source/drain of the second right-shift transistor 386, and another source/drain of the second right-shift transistor 386 is coupled to an input of a second inverter 388 (e.g., node SF2). The output of the second inverter 388 (e.g., node ST1) is coupled to one source/drain of the first right-shift transistor 381, and another source/drain of the first right-shift transistor 381 is coupled to an input of a second inverter (e.g., node SF2) for an adjacent compute component 331. Latch transistor 385 has a gate coupled to a LATCH control signal 384. One source/drain of the latch transistor 385 is coupled to node ST2, and another source/drain of the latch transistor 385 is coupled to node ST1.

Sense amplifiers 306 can be coupled to respective pairs of complementary sense lines 305-1 and 305-2, and corresponding compute components 331 coupled to the sense amplifiers 306 via respective pass gates 307-1 and 307-2. The gates of the pass gates 307-1 and 307-2 can be controlled by respective logical operation selection logic signals, "Passd" and "Passdb," which can be output from logical operation selection logic (not shown for clarity).

A first left-shift transistor 389 is coupled between node SF2 of one loadable shift register to node SF1 of a loadable shift register corresponding to an adjacent compute component 331. The channel of second left-shift transistor 390 is coupled from node ST2 to node ST1. The gate of the first left-shift transistor 389 is coupled to a first left-shift control line 391 (e.g., "PHASE 1L"), and the gate of the second left-shift transistor 390 is coupled to a second left-shift control line 392 (e.g., "PHASE 2L").

Figure 8:
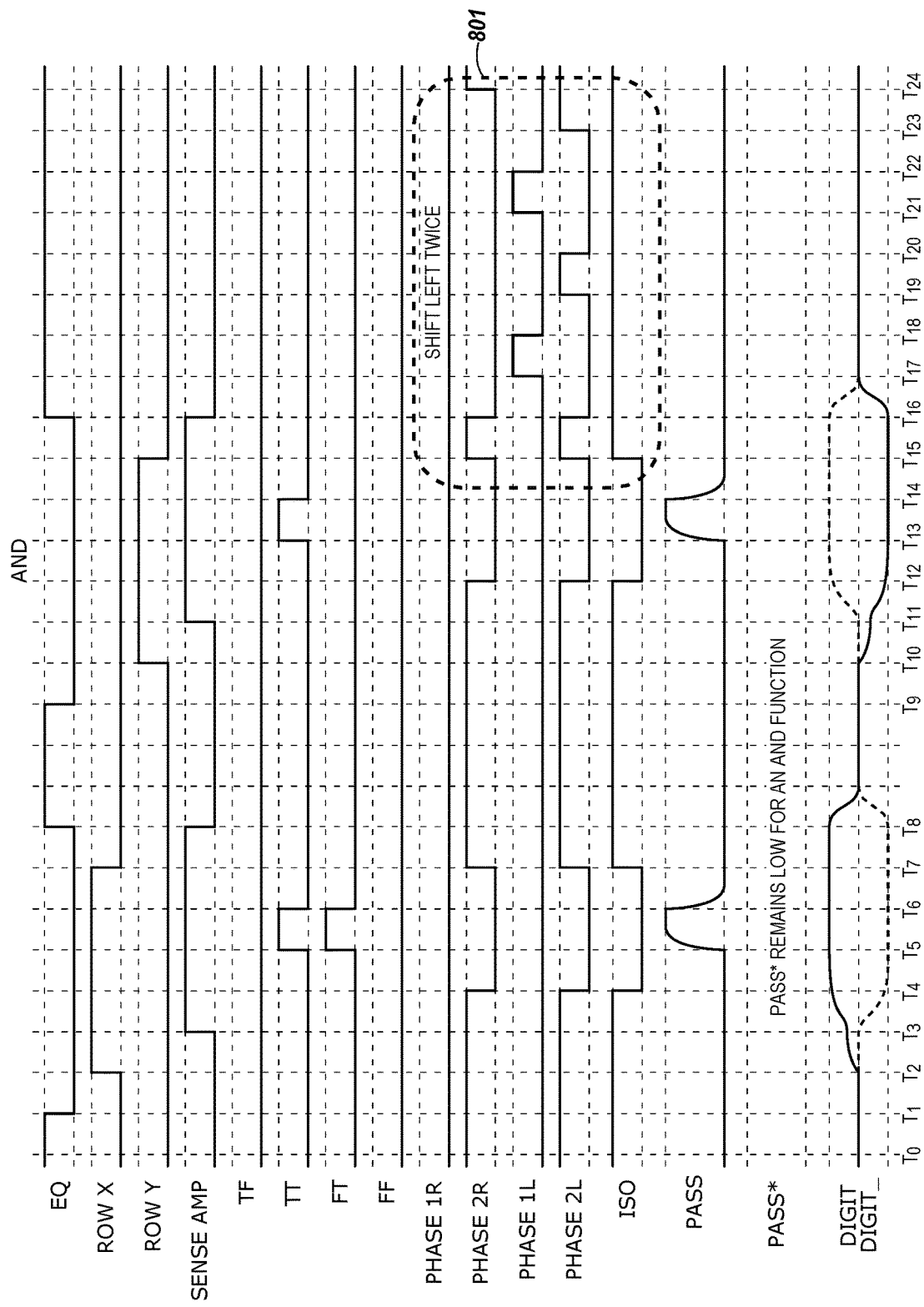
FIG. 8 illustrates a timing diagram associated with performing a logical operation and a shifting operation using the sensing circuitry in accordance with a number of embodiments of the present disclosure.
Figure 9:
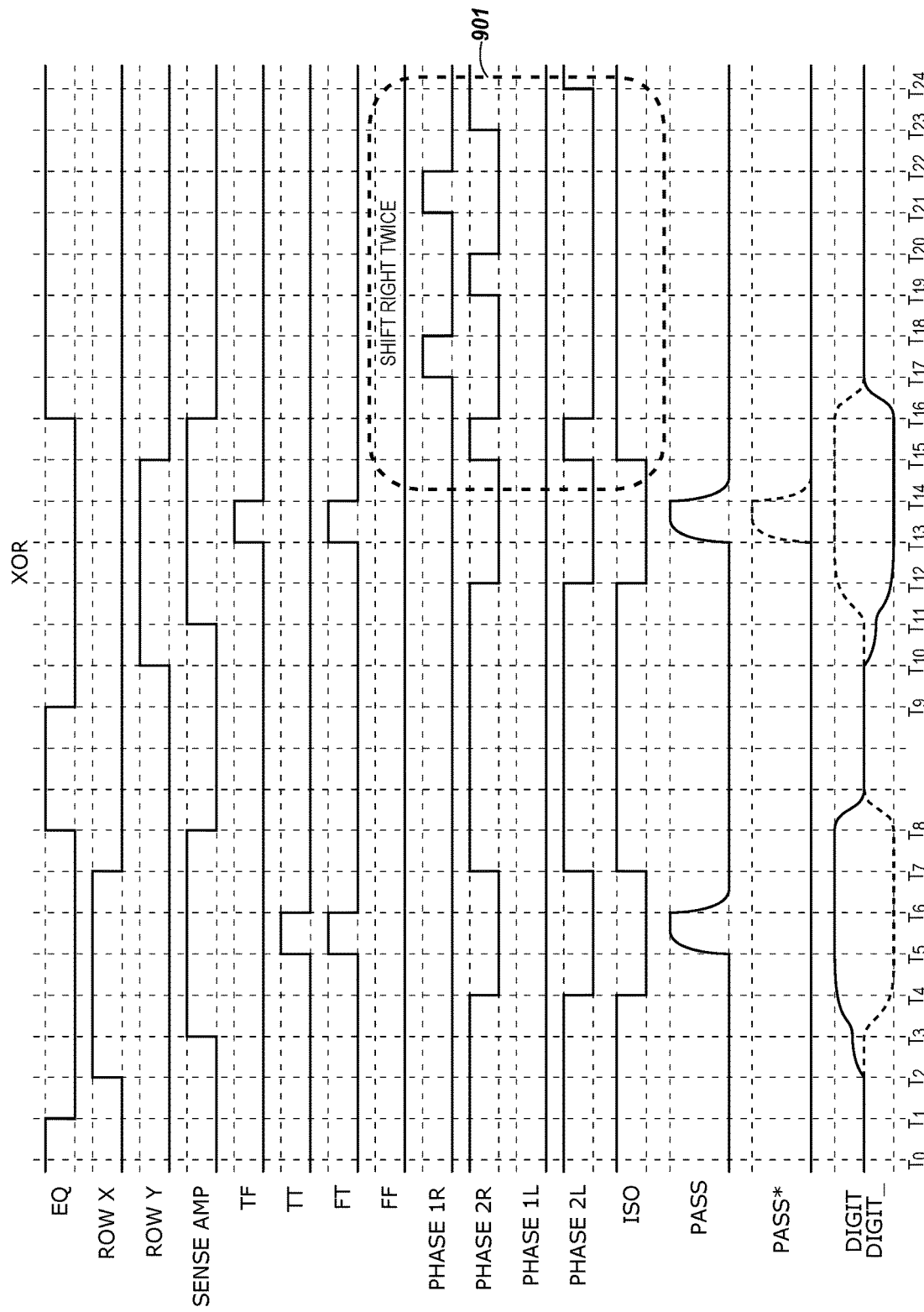
FIG. 9 illustrates a timing diagram associated with performing a logical operation and a shifting operation using the sensing circuitry in accordance with a number of embodiments of the present disclosure.

The logical operation selection logic 313-6 includes the swap gates 342, as well as logic to control the pass gates 307-1 and 307-2 and the swap gates 342. The logical operation selection logic 313-6 includes four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line). FIGS. 8 and 9 illustrate timing diagrams associated with performing logical operations and shifting operations using the sensing circuitry shown in FIG. 3.

Data values on the respective pairs of complementary sense lines 305-1 and 305-2 can be loaded into the corresponding compute components 331 (e.g., loadable shift register) by causing the pass gates 307-1 and 307-2 to conduct, such as by causing the Passd control signal to go high. Gates that are controlled to have continuity (e.g., electrical continuity through a channel) are conducting, and can be referred to herein as being OPEN. Gates that are controlled to not have continuity (e.g., electrical continuity through a channel) are said to be non-conducting, and can be referred to herein as being CLOSED. For instance, continuity refers to a low resistance condition in which a gate is conducting. The data values can be loaded into the respective compute components 331 by either the sense amplifier 306 overpowering the corresponding compute component 331 (e.g., to overwrite an existing data value in the compute component 331) and/or by turning off the PHASE 1R and PHASE 2R control signals 380 and 382 and the LATCH control signal 384. A first latch (e.g., sense amplifier) can be configured to overpower a second latch (e.g., compute component) when the current provided by the first latch and presented to the second latch is sufficient to flip the second latch.

The sense amplifier 306 can be configured to overpower the compute component 331 by driving the voltage on the pair of complementary sense lines 305-1 and 305-2 to the maximum power supply voltage corresponding to a data value (e.g., driving the pair of complementary sense lines 305-1 and 305-2 to the rails), which can change the data value stored in the compute component 331. According to a number of embodiments, the compute component 331 can be configured to communicate a data value to the pair of complementary sense lines 305-1 and 305-2 without driving the voltages of the pair of complementary sense lines 305-1 and 305-2 to the rails (e.g., to $V_{DD}$ or GND). As such, the compute component 331 can be configured to not overpower the sense amplifier 306 (e.g., the data values on the pair of complementary sense lines 305-1 and 305-2 from the compute component 331 will not change the data values stored in the sense amplifier 306 until the sense amplifier is enabled.

Once a data value is loaded into a compute component 331 of the loadable shift register, the true data value is separated from the complement data value by the first inverter 387. The data value can be shifted to the right (e.g., to an adjacent compute component 331) by alternate operation of first right-shift transistor 381 and second right-shift transistor 386, which can be accomplished when the first right-shift control line 380 and the second right-shift control line 382 have periodic signals that go high out-of-phase from one another (e.g., non-overlapping alternating square waves 180 degrees out of phase with one another). LATCH control signal 384 can be activated to cause latch transistor 385 to conduct, thereby latching the data value into a corresponding compute component 331 of the loadable shift register (e.g., while signal PHASE 1R remains low and PHASE 2R remains high to maintain the data value latched in the compute component 331).

Figure 4:
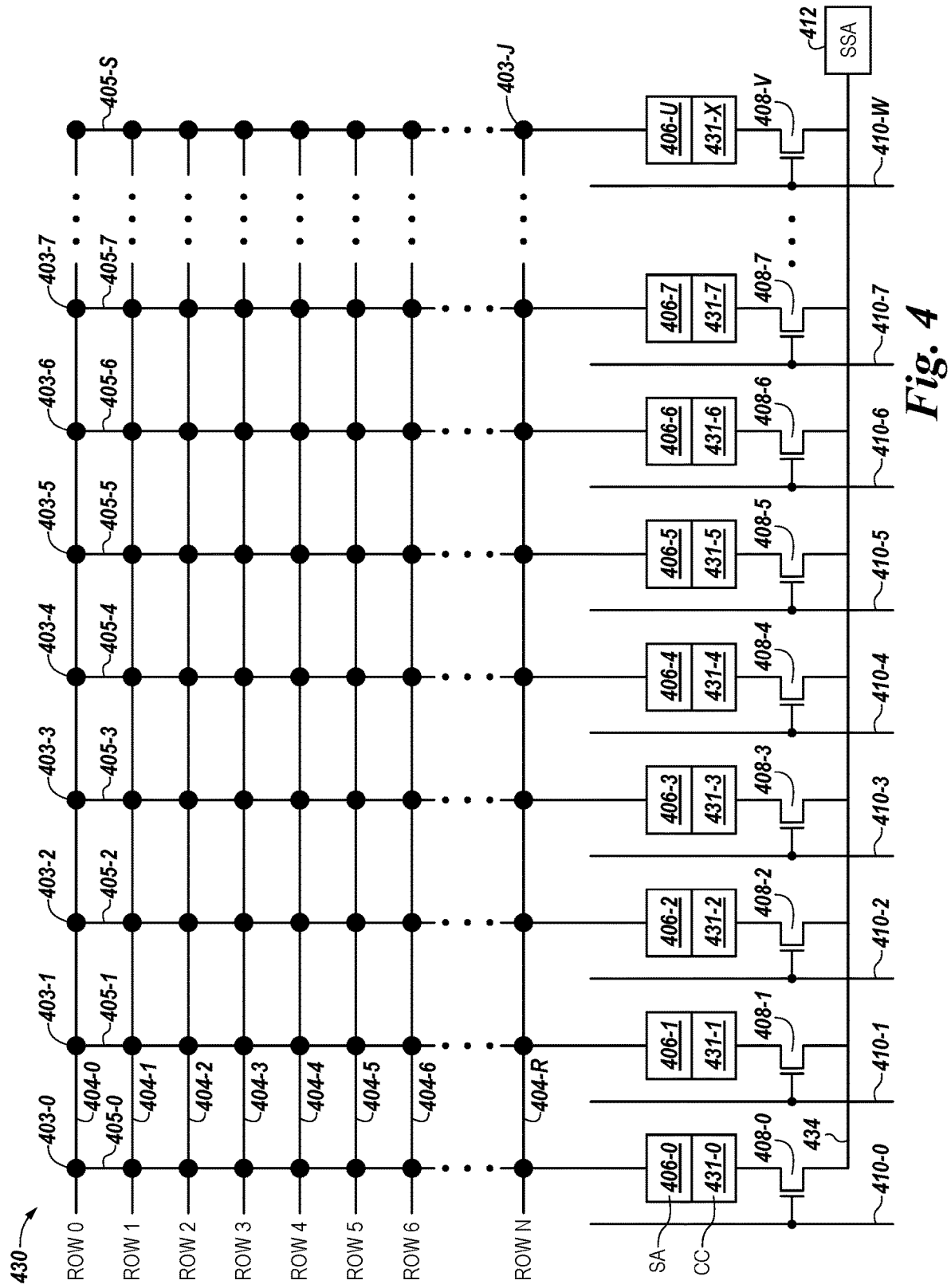
FIG. 4 is a schematic diagram of a portion of a memory array in accordance with a number of embodiments of the present disclosure.

FIG. 4 illustrates a schematic diagram of a portion of a memory array 430 in accordance with a number of embodiments of the present disclosure. The array 430 includes memory cells (referred to generally as memory cells 403, and more specifically as 403-0 to 403-J) coupled to rows of access lines 404-0, 404-1, 404-2, 404-3, 404-4, 404-5, 404-6, . . . , 404-R and columns of sense lines 405-0, 405-1, 405-2, 405-3, 405-4, 405-5, 405-6, 405-7, . . . , 405-S. Memory array 430 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 305-1 and 305-2 in FIG. 3).

Each column of memory cells can be coupled to sensing circuitry (e.g., sensing circuitry 150 shown in FIG. 1). In this example, the sensing circuitry comprises a number of sense amplifiers 406-0, 406-1, 406-2, 406-3, 406-4, 406-5, 406-6, 406-7, . . . , 406-U coupled to the respective sense lines 405-0, 405-1, 405-2, 405-3, 405-4, 405-5, 405-6, 1405-7, . . . , 405-S. The sense amplifiers 406 are coupled to input/output (I/O) line 434 (e.g., a local I/O line) via access devices (e.g., transistors) 408-0, 408-1, 408-2, 408-3, 408-4, 408-5, 408-6, 408-7, . . . , 408-V. In this example, the sensing circuitry also comprises a number of compute components 431-0, 431-1, 431-2, 431-3, 431-4, 431-5, 431-6, 431-7, . . . , 431-X coupled to the respective sense lines. Column decode lines 410-1 to 410-W are coupled to the gates of transistors 408-1 to 408-V, respectively, and can be selectively activated to transfer data sensed by respective sense amps 406-0 to 406-U and/or stored in respective compute components 431-0 to 431-X to a secondary sense amplifier 412. In a number of embodiments, the compute components 431 can be formed on pitch with the memory cells of their corresponding columns and/or with the corresponding sense amplifiers 406.

In a number of embodiments, the sensing circuitry (e.g., compute components 431 and sense amplifiers 406) is configured to perform corner turn operations on an element stored in array 401. As an example, a first element (e.g., a 4-bit element) can be stored in a first group of memory cells (e.g., cells 403-0 to 403-3) coupled to a particular access line (e.g., 404-0) and to a number of sense lines (e.g., 405-0 to 405-3), referred to herein as stored in a horizontal fashion, as illustrated. A number of corner turn operations can be performed on the first element, resulting in the first element being stored in a second group of memory cells coupled to a plurality of access lines (e.g., 304-1 to 304-4) and to a sense line (e.g., 405-0), referred to herein as stored in a vertical fashion, as illustrated.

In a number of embodiments, the sensing circuitry (e.g., compute components 431 and sense amplifiers 406) is configured to perform corner turn operations on a plurality of elements stored in array 401. As an example, a first plurality of elements (two elements each 4-bits wide, in this example) can be stored in a first group of memory cells (e.g., cells 403-0 to 403-7) coupled to a particular access line (e.g., 404-0) and to a number of sense lines (e.g., 405-0 to 405-7), referred to herein as stored in a horizontal fashion. A second plurality of elements (e.g., two elements each 4-bits wide, in this example) can be stored in a second group of memory cells coupled to a different access line (e.g., 404-1) and the respective number of sense lines (405-0 to 405-7). A number of corner turn operations can be performed on the first plurality of elements resulting in each of the elements being stored in a third group of memory cells coupled to a plurality of access lines and a sense line (e.g., in a vertical fashion, as illustrated). For example, a first element of the first plurality of elements can be stored in cells coupled to access lines 404-2 to 404-5 and sense line 405-0 after performing the number of corner turn operations. A second element of the first plurality of elements can be stored in cells coupled to access lines 404-2 to 404-5 and sense line 405-1 after performing the number of corner turns. In addition, after performing the number of corner turn operations, a first element of the second plurality of elements can be stored in cells coupled to access lines 404-2 to 404-5 and sense line 405-4 and a second element of the second plurality of elements can be stored in cells coupled to access lines 404-2 to 404-5 and sense line 405-5. While the example described above refers to two elements per row, examples are not so limited.

FIG. 5 illustrates a table showing the state of memory cells of an array at a particular phase associated with performing corner turn operations in accordance with a number of embodiments of the present disclosure. The reference numbers of the rows of the tables shown in FIG. 5 correspond to respective reference numbers of the pseudo code described below (e.g., row 551-*i* corresponds to reference number i of the pseudo code, rows 551-*i* to 551-*iii* correspond to reference number i to iii, respectively, of the pseudocode. Each row of the tables indicates the values of a number of bit vectors 531 (COMP_COMP), 533 (ELEM_SPAN), 535 (TMP_SHIFTED), 537 (E), 539 (VECTOR_BLOCK), and 541 (DEST) at a particular phase of the corner turn operation as can be stored in rows and/or columns of memory cells in the array (e.g., 430 in FIG. 4).

The example shown in FIG. 5 is associated with performing a corner turn on eight elements stored in memory cells coupled to a number of access lines (e.g., access lines 404-0 to 404-7 in FIG. 4) and to sense lines (e.g., sense lines 405-0 to 405-7 in FIG. 4). In addition, there are elements of [0X00] stored in cells coupled to access lines (e.g., access lines 404-0 to 404-7) and to sense lines (e.g., sense lines 405-8 to 405-31) that would be calculated but are equal to zero in this particular example. In this example, the eight elements are 8-bit wide elements. The eight elements to be corner turned are illustrated as bit-vectors in rows labeled as ROW 0 (corresponding to ROW 0 of FIG. 4), ROW 1, ROW 2, ROW 3, ROW 4, ROW 5, ROW 6, and ROW 7 of bit-vector DEST 541 in FIG. 5. The corner turning to be performed in association with the example below illustrated by FIGS. 5-6B includes corner turning data stored in a group of memory cells within the same group of memory cells that the data was originally stored in (referred to herein as an in-place corner turn). For example, data stored in eight (8) rows of memory cells and eight (8) columns of memory cells can be corner turned to be stored in a different fashion in the same 8 rows and 8 columns of memory cells. A first element stored in a first row of the 8 rows of cells can be corner turned to be stored in a first column of the 8 columns of cells where a first cell of the first column is also in the first row of cells.

As used herein, a vector (e.g., a bit-vector) can include a number (e.g., one or more) of elements. As used herein, the term "bit vector" is intended to mean a physically contiguous number of bits on a bit vector memory device, e.g., Processing In Memory (PIM) device, whether physically contiguous in rows (e.g., horizontally oriented) or columns (e.g., vertically oriented) in an array of memory cells. Thus, as used herein an operation on a bit vector can be intended to mean an operation that is performed on a bit-vector that is a contiguous portion of virtual address space, e.g., used by a PIM device. For example, a virtual address space may have a bit length of 256 bits. A portion of the virtual address space may or may not be contiguous physically to other portions in the virtual address space. Bit-vector DEST 541 is illustrated as including 8 rows but could include additional elements that can be stored in additional rows (e.g., in cells coupled to additional access lines 404-8, not illustrated, to 404-R). In this example, elements corresponding to cells coupled to eight access lines (e.g., 404-0 to 404-7) will be corner turned.

In the example below, the eight elements are represented by bit-vector DEST 541 (e.g., ROW 0 [1111 1111]; ROW 1 [1111 0000]; ROW 2 [1100 1100]; ROW 3 [1010 1010]; ROW 4 [0000 0000]; ROW 5 [0000 1111]; ROW 6 [0011 0011]; and ROW 7 [0101 0101]), which can be represented in hexadecimal notation as [0X FF; 0XF0; 0XCC; 0XAA; 0X00; 0X0F; 0X33; 0X55] (where the "0X" notation indicates hexadecimal and semicolons can separate each row of an element for ease of reference) and is shown in FIG. 5 as "ROW 0: 0XFF,00,00,00; ROW 1: 0XF0,00,00,00; ROW 2: 0XCC,00,00,00; ROW 3: 0XAA,00,00,00; ROW 4: 0X00, 00,00,00; ROW 5: 0X0F,00,00,00; ROW 6: 0X33,00,00,00; ROW 7: 0X55,00,00,00"). A first element of DEST 541 (e.g., [0XFF] in ROW 0) can represent a base ten (10) numerical value of 255. A second element of DEST 541 (e.g., [0XF0] in ROW 1) can represent a base ten (10) numerical value of 240. Further, a third element of DEST 541 (e.g., [0XCC] in ROW 2) can represent a numerical value of 204, a fourth element (e.g., [0XAA] in ROW 3) can represent a numerical value of 170, a fifth element (e.g., [0X00] in ROW 4) can represent a numerical value of 0, a sixth element (e.g., [0X0F] in ROW 5) can represent a numerical value of 15, a seventh element (e.g., [0X33] in ROW 6) can represent a numerical value of 51, and an eighth element (e.g., [0X55] in ROW 7) can represent a numerical value of 85.

As illustrated in FIG. 5, a bit-vector stored as COMP_COMP 531 corresponds to a row of compute components such as compute components 431 in FIG. 4. Bit-vectors ELEM_SPAN 533, TMP_SHIFTED 535, E 537, and VECTOR_BLOCK 539 each correspond to data stored in a row of cells. In contrast, bit-vector DEST 541 is illustrated as 8 rows of data, indicating eight bit-vectors stored in 8 separate rows of cells. While each of the bit-vectors includes 4 elements that are 8-bits wide each, the example below will focus on a first 8-bit element of each bit-vector for ease of reference in the example. For example, a first 8-bit element of the bit-vector of ROW 0 will be referred to rather than all 4 elements of the bit-vector as the second, third, and fourth elements of the bit-vector are each [0X00]. Bit-vectors of DEST 541 will be referenced such that a first element of a bit-vector of a first row of cells is separated by a semicolon from first elements of subsequent bit-vectors. For example, DEST 541 at row 551-i will be referenced as [0XFF; 0XF0; 0XCC; 0XAA; 0X00; 0X0F; 0X33; 0X55].

In this example, the bit-vectors ELEM_SPAN 533, TMP_SHIFTED 535, E 537, VECTOR_BLOCK 539, and DEST 541 have a length of 32 bits and four elements that are each 8 bits wide. It is noted that although hexadecimal notation is used in FIGS. 5-6B, the bit-vectors are stored as binary data patterns in the array during the corner turn operations. Also, in the examples described herein, commas and/or spaces may be used to separate elements within a bit-vector for ease of reference. For instance, in the example above, the bit-vectors 533 and 535 each comprise four elements which are separated out by commas. Embodiments are not limited to a particular element size (e.g., to a particular number of elements and/or bits per element). The result of the corner turn operations can be stored in array (e.g., 430) and/or can be transferred external to the array (e.g., to functional unit circuitry of a host).

The expected result of corner turning DEST 541 (e.g., [0XFF; 0XF0; 0XCC; 0XAA; 0X00; 0X0F; 0X33; 0X55]) is bit-vector [0XF0; 0XE1; 0XD2; 0XC3; 0XB4; 0XA5; 0X96; 0X87]. For example, a first element of the ROW 0 bit-vector (e.g., [0XFF]) is corner turned to go from being stored in memory cells coupled to an access line (e.g., access line 404-0) and a number of sense lines (e.g., sense lines 405-0 to 405-7) to being stored in memory cells coupled to a number of access lines (e.g., access lines 404-0 to 404-7) and a sense line (e.g., sense line 405-0). Put another way, the first element of the bit-vector of ROW 0 goes from being the first eight bits of the bit-vector of ROW 0 (e.g., stored in a horizontal fashion, as illustrated) to being stored as a first bit of each of bit-vectors of ROW 0 to ROW 7 (e.g., stored in a vertical fashion, as illustrated). As described further below, the result of performing a corner turn can be stored as bit-vectors in a particular group of memory cells that are the same as the group of memory cells the bit-vectors were originally stored in. For instance, in the example of FIG. 5, the memory cells corresponding to DEST 541 are used to store the result of the corner turn. As such, at the conclusion of the example described in FIGS. 5-6B, the value of DEST 541 [0XF0,00,00,00; 0XE1,00,00,00; 0XD2,00,00,00; 0XC3,00,00,00; 0XB4,00,00,00; 0XA5,00,00,00; 0X96,00,00,00; 0X87,00,00,00], which represents the eight elements being stored in a vertical fashion in the same cells as when the bit-vectors of DEST 541 were stored in the horizontal fashion.

As described further below, the bit vectors 533 (ELEM_SPAN), 535 (TMP_SHIFTED), 537 (E), 539 (VECTOR_BLOCK), and 541 (DEST) can be used in association with performing a plurality of corner turn operations on eight elements of the DEST bit-vector 541. The bit-vectors 533, 535, 537, 539, and 541 can be stored in respective groups of memory cells coupled to particular access lines, which may be referred to as temporary storage rows. As used herein, temporary storage rows of memory cells are storing data that may be updated during various phases of a plurality of corner turn operations. As an example, the bit-vectors 533 and 535 can have a same length as the DEST bit-vectors 541 (e.g., 32 bits in length), respectively, and can be stored in cells coupled to the same sense lines as the DEST bit-vector 541 (e.g., sense lines 405-0 to 405-31). For instance, the bit-vectors of 541 (DEST) can each have a length of 32 bits and can be stored in a group of cells coupled to access lines 404-0 to 404-7 (each corresponding to ROW 0 to ROW 7) and to sense lines 405-0 to 405-31. The bit-vectors 533 (ELEM_SPAN) and 535 (TMP_SHIFTED) can have lengths of 32 bits and can each be stored in a group of cells coupled to access lines 404-8 and 404-9, respectively, and to sense lines 405-0 to 405-31. Bit-vector 537 (E) can have a length of 4 bits and can be a different length in order to be used for internal calculations. Bit-vector 539 (VECTOR_BLOCK) can have a length of 8 bits and can be a different length in order to be used for internal calculations. The bit-vector 531 (COMP_COMP) represents the data stored in the sensing circuitry (e.g., compute components 431 and/or sense amplifiers 406) corresponding to the sense lines having cells coupled thereto which store elements being divided (e.g., sense lines 405-0 to 405-31 in this example).

In the example described in association with FIG. 5, the first element in ROW 0 of the DEST bit-vector 541 (e.g., hexadecimal value "FF" in the most significant element position) can be stored (e.g., as an eight bit bit-vector [1111 1111]) in memory cells 403-0 to 403-7 coupled to access line 304-0 (e.g., ROW 0). The first element in ROW 1 of the DEST bit-vector 541 (e.g., hexadecimal value "F0" in the most significant element position) can be stored (e.g., as an eight bit bit-vector [1111 0000]) in memory cells coupled to access line 404-1 (e.g., ROW 0) and to sense lines 405-0 to 405-7, and each of the first elements of subsequent ROWs 2 to 7 of bit-vector DEST 541 are stored in subsequent cells coupled to access lines 404-2 to 404-7, respectively, and to sense lines 405-0 to 405-7.

The below pseudocode represents instructions executable to perform a number of corner turn operations in a memory in accordance with a number of embodiments of the present disclosure. The example pseudocode is referenced using reference numbers i to d, which correspond to the reference numbers of the rows shown in the tables of FIG. 5 and in reference to the column numbers of FIG. 5. For instance, reference number i (e.g., "Obtain Temp Rows") corresponds to row 551-i, columns 531 to 541, reference number ii (e.g., "Compute Span Mask and Store Invert as ELEM_SPAN") corresponds to row 551-2, columns 531 and 533, and so forth.

i. Obtain Temp Rows ELEM_SPAN, TMP_LOOKUP, E, VECTOR_BLOCK, and DEST;
   ii. Compute Span Mask and Store Invert as ELEM_SPAN;
   iii. Compute Max Element;
   1. Run Outer Loop for Element Width;
      a. Calculate VECTOR_BLOCK Using Inverse of E;
      b. For Half of ELEM_SPAN, Move Elements E Distance on Left and Right;

c. Right SHIFT E by 1;
d. Shift ELEM_SPAN Equal to E, XOR with ELEM_SPAN and Store as ELEM_SPAN For purposes of discussion, the above pseudo code will be divided into a setup phase and a corner turn phase associated with performing a corner turn operation (e.g., corner turning the eight elements of the DEST bit-vector 541). The pseudo code referenced by reference numbers i-iii can correspond to the setup phase. The setup phase can be performed simultaneously for a number of the corner turn operations. In the example illustrated in FIG. 5, a bit-vector value illustrated in bold indicates a change in the value of the bit-vector (e.g., the value of the bit-vector stored in the memory cells corresponding to COMP_COMP 531 is shown in bold in FIG. 5 to indicate a change from [0X00000000] (as shown in row 551-*i*) to [0X00,FF,FF,FF] (as shown as COMP_COMP 531 in row 551-*ii*). FIG. 5 illustrates the values of a number of bit-vectors associated with performing the setup phase of a corner turn operation at rows 551-*i* to 551-*iii*. The pseudo code referenced by reference number 1 can correspond to the corner turn phase.

In a number of embodiments, the setup phase can be performed simultaneously for all of the elements that will be corner turned. The results (e.g., the resulting stored bit-vectors) corresponding to a number of operations performed in the setup phase are shown in FIG. 5. Rows 551-*i* to 551-*iii* of the table in FIG. 5 corresponds to the above pseudocode instructions referenced by reference numbers i to iii, respectively. As such, rows 551-*i* to 551-*iii* indicate values of the bit vectors 533, 535, 537, 539, and 541 during execution of the setup phase as described by the above pseudocode. Reference number i (e.g., "Obtain Temp Rows ELEM_SPAN, TMP_SHIFTED, E, VECTOR_BLOCK, and DEST") of the above pseudocode is associated with initializing a number of groups of memory cells for use as temporary storage rows to be used to store bit-vectors (e.g., 533, 535, 537, 539, and 541). Initializing refers to designating and/or assigning particular access lines used to store particular bit-vectors for performing the corner turn operation. For instance, the number of groups of memory cells can be initialized and/or designated groups of cells that can be coupled to respective access lines (e.g., rows) that store data (e.g., on a temporary basis) in association with performing the division operation. For example, a first group of memory cells can be coupled to a particular access line (e.g., 404-8, ROW 8, not shown) and can store a bit-vector referred to as a "ELEM_SPAN" bit-vector 533. A second group of memory cells can be coupled to another particular access line (e.g., 404-9, ROW 9, not shown) and can store bit-vector TMP_SHIFTED 535. A third group of memory cells can be coupled to another particular access line (e.g., 404-10, ROW 10, not shown) and can store bit-vector E 537. A fourth group of memory cells can be coupled to another particular access line (e.g., 404-11, ROW 11, not shown) and can store bit-vector VECTOR_BLOCK 539. A fifth group of memory cells can be coupled to a group of particular access lines (e.g., 404-0 to 404-7, ROWs 0 to 7) and can store bit-vectors of DEST 541. Embodiments are not limited to a particular number of temporary storage rows and/or to storage of the corresponding bit-vectors on particular access lines. Also, although the groups of memory cells used to store bit-vectors 533, 535, 537, 539, and 541 may be referred to as "rows," the respective groups of memory cells may comprise fewer than all of the cells coupled to a particular access line (e.g. ROW). Furthermore, in a number of embodiments, temporary storage rows can refer to access lines which may not be addressable by a user (e.g., access lines that are outside of a user-addressable address space). In addition, a bit-vector to be corner turned can be loaded as DEST 541 (e.g., [0XFF,00,00,00; 0XF0,00,00,00; 0XCC,00,00,00; 0XAA,00,00,00; 0X00,00,00,00; 0X0F,00,00,00; 0X0F,00,00,00; 0X33,00,00,00; 0X55,00,00,00], as illustrated at row 551-*i*). At the end of the corner turn operations, the result of the corner turn operations will be stored as DEST 541, as illustrated at row 553-4*b* in FIG. 5.

Reference number ii (e.g., "Compute Span Mask and Store Invert as ELEM_MASK") of the above pseudocode can be associated with determining a span mask, inverting the span mask, and storing the inverted span mask as bit-vector ELEM_MASK 533. The span mask can be determined by setting data units (e.g., bits) of a first element of the bit-vector stored as COMP_COMP 531 to a particular data value (e.g., a "1"). The set data units can be shifted one position to the right, resulting in [0X7F,00,00,00]. The resultant bit-vector (e.g., [0X7F,00,00,00]) can be inverted (e.g., resulting in [0X80,00,00,00]). The inverted resultant bit-vector (e.g., [0X80,00,00,00]) can be stored as ELEM_SPAN 533. The bit-vector ELEM_SPAN 533 can be loaded as COMP_COMP 531 and shifted right one position (e.g., resulting in [0X40,00,00,00]) and an OR operation can be performed with the right-shifted bit-vector (e.g., [0X40,00,00,00]) and COMP_COMP 531 (e.g., [0X80,00,00,00]), resulting in [0XC0,00,00,00]. This can be repeated by performing storing the ORed result as ELEM_SPAN 533, shifting right once, and performing an OR operation again to result in [0XFF,00,00,00]. The resulting bit-vector of the number of OR operations (e.g., [0XFF,00,00,00]) can be inverted (e.g., resulting in [0X00,FF,FF,FF) and stored as ELEM_SPAN 533, as is illustrated at 551-*ii*.

Reference number iii (e.g., "Compute Maximum Element") of the above pseudocode can be associated with determining a maximum element value that indicates when to terminate a number of INNER LOOPS (described further below in relation to FIGS. 6A-6B). The maximum element can be determined by multiplying an element width (e.g., 8 bits) by a number of elements in a bit-vector (e.g., 4 elements per bit-vector), resulting in a maximum element value of 32 (used further in association with FIGS. 6A-6B below).

At the conclusion of the setup phase corresponding to reference numbers i-iii of the above pseudocode, and as shown in row 551-*iii* of FIG. 5, ELEM_SPAN 533 stores [0X00,FF,FF,FF] (e.g., binary [0000 0000, 1111 1111, 1111 1111, 1111 1111]), TMP_SHIFTED 535 stores [0X00,00,00,00], E 537 stores [0X0, VECTOR_BLOCK 539 stores [0X00], and DEST 541 stores [0XFF,00,00,00; 0XF0,00,00,00; 0XCC,00,00,00; 0XAA,00,00,00; 0X00,00,00,00; 0X0F,00,00,00; 0X33,00,00,00; 0X55,00,00,00].

Reference number 1 (e.g., reference numbers 1a to 1d) of the above pseudocode corresponds to the corner turn phase of a corner turn operation in accordance with a number of embodiments of the present disclosure. Reference number 1 (e.g., "Run Outer Loop for element width") of the above pseudocode is associated with performing a LOOP including a number of iterations corresponding to an element width. In this example, each of the elements of DEST 541 are 8 bits wide therefore eight iterations of the loop can be performed (and four will be illustrated for ease of reference as a result is achieved after four iterations). A first iteration of the loop is associated with the description of FIG. 5 at rows 553-1*a* to 553-1*d* which corresponds to reference numbers 1a to 1f for a first iteration (where the "1" of 553-1 a first iteration). A second iteration of the loop is associated with the description of FIG. 5 at rows 553-2*a* to 553-2*d*, which corresponds to reference numbers 1a to 1f for a second iteration. Likewise, a third iteration is associated with FIG. 5 at rows 553-3a to 553-3d and a fourth iteration is associated with FIG. 5 at rows 553-4a to 553-4d.

During a first iteration of the loop, reference number 1a (e.g., "Calculate VECTOR_BLOCK Using Inverse of E") of the above pseudocode is associated with determining VECTOR_BLOCK 437 for a particular iteration. The VECTOR_BLOCK 539 can be determined by inverting E 537 (e.g., [0X8]). Bit-vector E 537 can be a local temporary integer used to increment data during the number of corner turn operations. The invert of [0X8], for this first iteration, is equal to [0X7], and is stored as VECTOR_BLOCK 539 [0XF7], as is illustrated at row 553-1a.

Reference number 1b (e.g., "For Half of ELEM_SPAN, Move Elements E Distance on Left and Right") of the above pseudocode is associated with performing a number of inner LOOPS on DEST 541 to move a particular portion of the elements of DEST 541 a particular distance. Moving the particular portion of the elements in relation to reference number 1b is further described below in association with FIGS. 6A-6B. A result of moving the elements in association with reference number 1b results in DEST 541 being [0XFF, 00,00,00; 0XF0,00,00,00; 0XCC,00,00,00; 0XAA,00,00,00; 0X00,00,00,00; 0X 0F,00,00,00; 0X33,00,00,00; 0X55,00, 00,00] (e.g., unchanged from the previous DEST 541).

Reference number 1c (e.g., "Right SHIFT E by 1") of the above pseudocode is associated with shifting E 537 (e.g, [0X8], binary [1000]) one position to the right. A result of shifting E 537 (e.g., [0X8]) is [0X4], binary [0100]. The result (e.g., [0X4]) is stored as E 537 at row 553-1c.

Reference number 1d (e.g., "Shift ELEM_SPAN Equal to E, XOR with ELEM_SPAN and Store as ELEM_SPAN") of the above pseudocode is associated with shifting ELEM_SPAN 533 (e.g., [0X00,FF,FF,FF]) a number of positions to the Left equal to E (e.g., [0X4]) using the compute components, resulting in [0X0F,FF,FF,F0] being stored as COMP_COMP 531. The result of the shift (e.g., COMP_COMP 531 being [0X0F,FF,FF,F0]) is XORed with ELEM_SPAN 533 (e.g., [0X00,FF,FF,FF]), resulting in [0X0F,00,00,0F] being stored as ELEM_SPAN 533, as illustrated at row 553-1d.

During a second iteration of the loop, reference number 1a (e.g., "Calculate VECTOR_BLOCK Using Inverse of E") of the above pseudocode is associated with determining VECTOR_BLOCK 437 for a particular iteration. The VECTOR_BLOCK 539 can be determined by inverting E 537 (e.g., [0X4]). The invert of [0X4], for this second iteration, is equal to [0XB], and is stored as VECTOR_BLOCK 539 [0XFB] as is illustrated at row 553-2a.

Reference number 1b (e.g., "For Half of ELEM_SPAN, Move Elements E Distance on Left and Right") of the above pseudocode is associated with performing a number of inner LOOPS on DEST 541 to move a particular portion of the elements of DEST 541 a particular distance. Moving the particular portion of the elements in relation to reference number 1b is further described below in association with FIGS. 6A-6B. A result of moving the elements in association with reference number 1b results in DEST 541 being [0XF0, 00,00,00; 0XF0,00,00,00; 0XC3,00,00,00; 0XA5,00,00,00; 0XF0,00,00,00; 0X 0F,00,00,00; 0XC3,00,00,00; 0XA5,00, 00,00]. A first loop of the inner loops of this second iteration is described further in association with FIG. 6A.

Reference number 1c (e.g., "Right SHIFT E by 1") of the above pseudocode is associated with shifting E 537 (e.g, [0X4], binary [1000]) one position to the right. A result of shifting E 537 (e.g., [0X4]) is [0X2], binary [0010]. The result (e.g., [0X2]) is stored as E 537 at row 553-2c.

Reference number 1d (e.g., "Shift ELEM_SPAN Equal to E, XOR with ELEM_SPAN and Store as ELEM_SPAN") of the above pseudocode is associated with shifting ELEM_SPAN 533 (e.g., [0X0F,00,00,0F]) a number of positions to the Left equal to E (e.g., [0X2]) using the compute components, resulting in [0X3C,00,00,3C] being stored as COMP_COMP 531. The result of the shift (e.g., COMP_COMP 531 being [0X3C,00,00,3C]) is XORed with ELEM_SPAN 533 (e.g., [0X00,FF,FF,FF]), resulting in [0X33,00,00,33] being stored as ELEM_SPAN 533, as illustrated at row 553-2d.

During a third iteration of the loop, reference number 1a (e.g., "Calculate VECTOR_BLOCK Using Inverse of E") of the above pseudocode is associated with determining VECTOR_BLOCK 437 for a particular iteration. The VECTOR_BLOCK 539 can be determined by inverting E 537 (e.g., [0X2]). The invert of [0X2], for this first iteration, is equal to [0XD], and is stored as VECTOR_BLOCK 539 [0XFD] as is illustrated at row 553-3a.

Reference number 1b (e.g., "For Half of ELEM_SPAN, Move Elements E Distance on Left and Right") of the above pseudocode is associated with performing a number of inner LOOPS on DEST 541 to move a particular portion of the elements of DEST 541 a particular distance. Moving the particular portion of the elements in relation to reference number 1b is further described below in association with FIGS. 6A-6B. A result of moving the elements in association with reference number 1b results in DEST 541 being [0XF0, 00,00,00; 0XE1,00,00,00; 0XC3,00,00,00; 0XE1,00,00,00; 0XF0,00,00,00; 0X2D,00,00,00; 0XC3,00,00,00; 0X2D,00, 00,00].

Reference number 1c (e.g., "Right SHIFT E by 1") of the above pseudocode is associated with shifting E 537 (e.g, [0X2], binary [0010]) one position to the right. A result of shifting E 537 (e.g., [0X2]) is [0X1], binary [0001]. The result (e.g., [0X1]) is stored as E 537 at row 553-3c.

Reference number 1d (e.g., "Shift ELEM_SPAN Equal to E, XOR with ELEM_SPAN and Store as ELEM_SPAN") of the above pseudocode is associated with shifting ELEM_SPAN 533 (e.g., [0X33,00,00,33]) a number of positions to the Left equal to E (e.g., [0X1]) using the compute components, resulting in [0X66,00,00,66] being stored as COMP_COMP 531. The result of the shift (e.g., COMP_COMP 531 being [0X66,00,00,66]) is XORed with ELEM_SPAN 533 (e.g., [0X33,00,00,33]), resulting in [0X55,00,00,55] being stored as ELEM_SPAN 533, as illustrated at row 553-3d.

During a fourth iteration of the loop, reference number 1a (e.g., "Calculate VECTOR_BLOCK Using Inverse of E") of the above pseudocode is associated with determining VECTOR_BLOCK 437 for a particular iteration. The VECTOR_BLOCK 539 can be determined by inverting E 537 (e.g., [0X1]). The invert of [0X8], for this first iteration, is equal to [0XE], and is stored as VECTOR_BLOCK 539 [0XFE] as is illustrated at 402 553-1a.

Reference number 1b (e.g., "For Half of ELEM_SPAN, Move Elements E Distance on Left and Right") of the above pseudocode is associated with performing a number of inner LOOPS on DEST 541 to move a particular portion of the elements of DEST 541 a particular distance. Moving the particular portion of the elements in relation to reference number 1b is further described below in association with FIGS. 6A-6B. A result of moving the elements in association with reference number 1b results in DEST 541 being [0XF0, 00,00,00; 0XE1,00,00,00; 0XD2,00,00,00; 0XC3,00,00,00; 0XB4,00,00,00; 0XA5,00,00,00; 0X96,00,00,00; 0X87,00, 00,00].

Reference number 1c (e.g., "Right SHIFT E by 1") of the above pseudocode is associated with shifting E 537 (e.g, [0X1], binary [0001]) one position to the right. A result of shifting E 537 (e.g., [0X1]) is [0X0], binary [0000]. The result (e.g., [0X0]) is stored as E 537 at row 553-4*c*.

Reference number 1d (e.g., "Shift ELEM_SPAN Equal to E, XOR with ELEM_SPAN and Store as ELEM_SPAN") of the above pseudocode is associated with shifting ELEM_S-PAN 533 (e.g., [0X55,00,00,55]) a number of positions to the Left equal to E (e.g., [0X0]) using the compute components, resulting in [0X55,00,00,55] being stored as COMP_COMP 531. The result of the shift (e.g., COMP_COMP 531 being [0X55,00,00,5]) is XORed with ELEM_SPAN 533 (e.g., [0X55,00,00,55]), resulting in [0X00,00,00,00] being stored as ELEM_SPAN 533, as illustrated at row 553-4*d*.

At the conclusion of the inner LOOPS performed in association with reference numbers 1a to 1d illustrated at rows 553-1*a* to 553-4*d*, the DEST 541 is [0XF0,00,00,00; 0XE1,00,00,00; 0XD2,00,00,00; 0XC3,00,00,00; 0XB4,00, 00,00; 0XA5,00,00,00; 0X96,00,00,00; 0X87,00,00,00]. The resulting DEST 541 illustrates a corner turn performed on elements stored in ROWs 0 to 7 that were stored in a horizontal fashion (e.g., in cells coupled to an access line and a plurality of sense lines for each element) that results in those elements being stored in ROWs 0 to 7 that are stored in a vertical fashion (e.g., in cells coupled to a plurality of access lines and a sense line for each element). For example, a first element of ROW 0 (e.g., [0XFF]) originally stored in cells coupled to a first access line (e.g., 404-0 in FIG. 4) and a plurality of sense lines (e.g., 405-0 to 405-7 in FIG. 4) is stored, after the corner turn, in cells coupled to a plurality of access lines (e.g., 404-0 to 404-7) and sense line (e.g., 405-0). The first bit of this first element can be stored in a same cell as the corner turn is performed in order to store the cells in the same array of cells. Put another way, if 8 elements are stored in an 8×8 array of cells, the corner turned elements will be stored in that same 8×8 array of cells subsequent to the corner turn (referred to as an in-place corner turn).

FIGS. 6A-6B each illustrate a table showing the state of memory cells of an array at a particular phase associated with performing corner turn operations in accordance with a number of embodiments of the present disclosure. FIG. 6A is an illustration of a first inner LOOP of a second iteration of the Outer LOOP described above in relation to FIG. 5. The reference numbers of the rows of the table shown in FIG. 6A correspond to respective reference numbers of the pseudo code described below (e.g., 653-2*b* corresponds to a second iteration of an Outer LOOP associated with reference number 1b of the pseudo code). Each row of the tables indicates the values of a number of bit vectors 631 (COMP_COMP), 633 (ELEM_SPAN), 635 (TMP_SHIFTED), 637 (E), 638 (R), 639 (VECTOR_BLOCK), and DEST 641 at a particular phase of the corner turn operation as can be stored in rows and/or columns of memory cells in the array (e.g., 430 in FIG. 4).

The example shown in FIG. 6A is associated with performing a first inner loop (e.g. Inner LOOP "0") associated with reference number 1b (e.g., "For Half of ELEM_SPAN, Move Elements E Distance on Left and Right"). A number of inner LOOPS can be performed in association with reference number 1b referenced in FIG. 5 above. In this example, each of the elements of DEST 541 are 8 bits wide and there are 8 elements referenced, on in each of ROWs 0 to 7. A first iteration of the inner LOOP is associated with the description of FIG. 6A at rows 653-2*b*.0.*i* to 653-2*b*.0.*xii* which corresponds to reference numbers i to xii described below. FIG. 6B is associated with a result of DEST 641 at the conclusion of each of the inner LOOPs of the second Outer LOOP. For example, a value of DEST 641 prior to performance of the Inner LOOPS of the second Outer LOOP can be DEST 641 [0XFF,00,00,00; 0XF0,00,00,00; 0XCC, 00,00,00; 0XAA,00,00,00; 0X00,00,00,00; 0X0F,00,00,00; 0X33,00,00,00; 0X55,00,00,00] as illustrated at column 653-2. A result of a first Inner LOOP (e.g., Inner LOOP "0") of the second Outer LOOP results in DEST 641 [0XF0,00, 00,00; 0XF0,00,00,00; 0XCC,00,00,00; 0XAA,00,00,00; 0XF0,00,00,00; 0X0F,00,00,00; 0X33,00,00,00; 0X55,00, 00,00], as illustrated at column 653-2*b*.0 in FIG. 6B. A second Inner LOOP (e.g., Inner LOOP "1") of the second Outer LOOP can be associated with a result of DEST 641 at column 653-2*b*.1, a third Inner LOOP (e.g., Inner LOOP "2") of the second Outer LOOP can be associated with a result of DEST 641 at column 653-2*b*.2, and a fourth Inner LOOP (e.g., Inner LOOP "3") of the second Outer LOOP can be associated with a result of DEST 641 at column 653-2.*b*.3. The result after the fourth Inner LOOP is also illustrated at 553-2*b* in FIG. 5.

The below pseudocode represents instructions executable to perform a number of corner turn operations in a memory in accordance with a number of embodiments of the present disclosure. The example pseudocode is referenced using reference numbers 2b.i to 2b.xii, which correspond to the reference numbers of the rows shown in the tables of FIG. 6A (and correspond to the "2*b*" of 553-2*b* in FIG. 5). For instance, reference number 2b.i (e.g., "Load (R+E) as COMP_COMP") corresponds to row 653-2*b*.0.*i*, columns 631 and 641; reference number 2b.ii (e.g., "SHIFT COMP_COMP RIGHT Equal to E") corresponds to row 653-2*b*.0.*ii*, column 631, and so forth.

2b.i Load ROW (R+E) as COMP_COMP;
2b.ii SHIFT COMP_COMP Right Equal to E;
2b.iii XOR COMP_COMP and R
2b.iv AND COMP_COMP and ELEM_SPAN
2b.v Store COMP_COMP as TMP_SHIFTED
2b.vi XOR COMP_COMP and R
2b.vii Store COMP_COMP as R
2b.viii Load TMP_SHIFTED as COMP_COMP
2b.ix SHIFT COMP_COMP LEFT Equal to E
2b.x XOR COMP_COMP and (R+E)
2b.xi Store COMP_COMP as (R+E)
2b.xii Determine R by R=VECTOR_BLOCK ANDed with (R+1+E)

Reference number 2b.i (e.g., "Load (R+E) as COMP_COMP") of the above pseudocode can be associated with loading a bit-vector as COMP_COMP 631. The bit-vector to be loaded is determined by (R+E), which, during this first iteration of the Inner LOOP (INNER LOOP "0"), is computed based on R=0 (e.g., R 638 is [0X00]) and E=4 (e.g., E 637 is [0X4]). Bit-vector R 638 can be a local temporary integer used to increment data to perform the number of corner turn operations. Therefore, the bit-vector to be loaded is 0+4=4 so bit-vector from ROW 4 of DEST 641 (e.g., [0X00,00,00,00]) is loaded as COMP_COMP 631, as is illustrated at row 653-2*b*.0.*i*. Reference number 2b.ii (e.g., "SHIFT COMP_COMP Right Equal to E") of the above pseudocode is associated with performing a shift operation to the Left equal to E (e.g., [0X4]) on COMP_COMP 631 (e.g., 0X00,00,00,00]). The result of shifting COMP_COMP 631 (e.g., [0X00,00,00,00]) is [0X00,00,00,00]. Reference number 2b.iii (e.g., "XOR COMP_COMP and R") of the above pseudocode is associated with performing an XOR operation on COMP_COMP 631 (e.g., [0X00,00,00,00]) and R (which is the bit-vector of ROW 0 [0XFF,00,00,00] as R 638 is [0X00]), resulting in bit-vector [0XFF,00,00,00] as COMP_COMP 631.

Reference number 2b.iv (e.g., "AND COMP_COMP and ELEM_SPAN") of the above pseudocode is associated with performing an AND operation on COMP_COMP 631 (e.g., [0XFF,00,00,00]) and ELEM_SPAN 633 (e.g., [0X0F,00,00, 0F]), resulting in [0X0F,00,00,00]. Reference number 2b.v (e.g., "Store COMP_COMP as TMP_SHIFTED") of the above pseudocode is associated with storing COMP_COMP 631 (e.g., [0X0F,00,00,00]) as TMP_SHIFTED 635, as illustrated at 653-2b.0.v. Reference number 2b.vi (e.g., "XOR COMP_COMP and R") of the above pseudocode is associated with performing an XOR operation on COMP_COMP 631 (e.g., [0X0F,00,00,00]) and R (e.g., ROW 0, which is [0XFF,00,00,00]), resulting in [0XF0,00,00,00]. Reference number 2b.vii (e.g., "Store COMP_COMP as R") of the above pseudocode is associated with storing COMP_COMP 631 (e.g., [0XF0,00,00,00]) as R (e.g., stored as ROW 0 during this first inner LOOP as R=0), as illustrated at 653-2b.0.vii.

Reference number 2b.viii (e.g., "Load TMP_SHIFTED as COMP_COMP") of the above pseudocode is associated with loading TMP_SHIFTED 635 (e.g. [0X0F,00,00,00]) as COMP_COMP 631, as illustrated at 653-2b.0.viii. Reference number 2b.ix (e.g., "SHIFT COMP_COMP Left Equal to E") of the above pseudocode is associated with performing a SHIFT operation on COMP_COMP 631 (e.g., [0X0F, 00,00,00]) equal to E (e.g., [0X4], or 4 positions) to the left. COMP_COMP 631 (e.g., [0X0F,00,00,00]) shifted 4 positions to the left results in [0XF0,00,00,00]. Reference number 2.b.x (e.g., "XOR COMP_COMP and (R+E)") of the above pseudocode is associated with performing on XOR operation on COMP_COMP 631 (e.g., [0XF0,00,00,00]) and a bit-vector corresponding to ROW (R+E), where R=0 during this Inner LOOP and E=4 (e.g., [0X4]), so COMP_COMP 631 is XORed with ROW 4 (e.g., [0X00,00,00,00]). The result of the XOR operation is [0XF0,00,00,00]. Reference number 2b.xi (e.g., "Store COMP_COMP as (R+E)") of the above pseudocode is associated with storing COMP_COMP 631 (e.g., [0XF0,00,00,00]) as ROW 4 (based on R=0 and E=4, so 0+4=4), as illustrated at row 653-2b.0.xi.

Reference number 2b.xii (e.g., "Determine R by R=VECTOR_BLOCK ANDed with (R+1+E)") of the above pseudocode is associated with determining a value of R (e.g., a bit-vector row for further LOOPs) based on performing an AND with VECTOR_BLOCK 639 (e.g., [0X0FB) and (R+1+E), where R=0 and E=4 (so 5 is represented by bit-vector [0101]). Performing an AND on [0XFB] or binary [1111 1011] (e.g., VECTOR_BLOCK 639) and [0000 0101] (e.g., R+1+E) results in [0000 0001], which indicates to change R to 1 as (illustrated at row 653-2b.0.xii) for the next Inner LOOP to be performed. At the conclusion of the first Inner LOOP (e.g., Inner LOOP "0"), DEST 641 is [0XF0, 00,00,00; 0XF0,00,00,00; 0XCC,00,00,00; 0XAA,00,00,00; 0XF0,00,00,00; 0X0F,00,00,00; 0X33,00,00,00; 0X55,00, 00,00].

FIG. 6B illustrates a table showing the state of memory cells of an array at a particular phase associated with performing corner turn operations in accordance with a number of embodiments of the present disclosure. FIG. 6B illustrates a value of DEST 641 at the conclusion of a number of Inner LOOPs associated with a second Outer LOOP (e.g., associated with rows 553-2a to 553-2d). At column 653-2, indicating a beginning value of DEST 641 prior to the second Outer LOOP, DEST 641 is [0XFF,00, 00,00; 0XF0,00,00,00; 0XCC,00,00,00; 0XAA,00,00,00; 0X00,00,00,00; 0X0F,00,00,00; 0X33,00,00,00; 0X55,00, 00,00]. After performance of a first Inner LOOP (e.g., Inner LOOP "0" associated with rows 653-2b.0.i to 653-2b.0.xii of FIG. 6A), DEST 641, at column 653-2b.0, is equal to [0XF0,00,00,00; 0XF0,00,00,00; 0XCC,00,00,00; 0XAA, 00,00,00; 0XF0,00,00,00; 0X0F,00,00,00; 0X33,00,00,00; 0X55,00,00,00] (where bolded bits indicate a changed row). The first Inner LOOP can be associated with modifying data values of ROW 0 and ROW 4 (bolded), where data values of ROW 0 are relocated to ROW 4. Subsequent Inner LOOPS are associated with similar modifications. For example, a second Inner LOOP (e.g., Inner LOOP "1"), is associated with modifying ROW 1 and ROW 5, a third Inner LOOP (e.g., "2") is associated with modifying ROW 2 and ROW 6, and a fourth Inner LOOP (e.g., "3") is associated with modifying ROW 3 and ROW 7.

After performance of the second Inner LOOP (e.g., Inner LOOP "1"), DEST 641, at column 653-2b.1, is [0XF0,00, 00,00; 0XF0,00,00,00; 0XCC,00,00,00; 0XAA,00,00,00,00; 0XF0,00,00,00; 0X0F,00,00,00; 0X33,00,00,00; 0X55,00, 00,00]. After performance of the third Inner LOOP (e.g., Inner LOOP "2"), DEST 641, at column 653-2b.2 is [0XF0, 00,00,00; 0XF0,00,00,00; 0XC3,00,00,00; 0XAA,00,00,00; 0XF0,00,00,00; 0X0F,00,00,00; 0XC3,00,00,00; 0X55,00, 00,00]. After performance of the fourth Inner LOOP (e.g., Inner LOOP "3"), DEST 641, at column 653-2b.3 is [0XF0, 00,00,00; 0XF0,00,00,00; 0XC3,00,00,00; 0XA5,00,00,00; 0XF0,00,00,00; 0X0F,00,00,00; 0XC3,00,00,00; 0XA5,00, 00,00]. At the conclusion of the fourth Inner LOOP of the second Outer LOOP, r=8 and therefore the eight rows of interest in this case have had a portion of a corner turn performed on them and subsequent Inner LOOPS of the second outer LOOP do not modify these eight rows. Hence, the value of DEST 641 at column 653-2b.3 is indicate at row 553-2b of FIG. 5 as the value of DEST 641 at the conclusion of Inner LOOPs for the second Outer LOOP. Similar Inner LOOPS (not fully described here but illustrated in the pseudocode) are performed for the first Outer LOOP (associated with 553-1a to 553-1d), third Outer LOOP (associated with 553-3a to 553-3d), and fourth Outer LOOP (associated with 553-4a to 553-4d).

The value of DEST 641 at row 553-4b of FIG. 5 is an illustration of fully corner turned data. For example, DEST 641 at row 551-i is [0XFF,00,00,00; 0XF0,00,00,00; 0XCC, 00,00,00; 0XAA,00,00,00; 0X00,00,00,00; 0X0F,00,00,00; 0X33,00,00,00; 0X55,00,00,00]. The value of DEST 641 at row 551-i is corner turned and results in the value of DEST 641 at row 553-4b, which is [0XF0,00,00,00; 0XE1,00,00, 00; 0XD2,00,00,00; 0XC3,00,00,00; 0XB4,00,00,00; 0XA5,00,00,00; 0X96,00,00,00; 0X87,00,00,00]. The first element (e.g., [0XFF]) of ROW 0 is corner turned from being stored horizontally in ROW 0 to being stored vertically as the first bit of each of the bit-vectors stored in ROWs 0 to 7. The element (e.g., [0XF0]) of ROW 1 goes from being stored horizontally in ROW 1 to being stored vertically as the second bit of each of the bit-vectors stored in ROWs 0 to 7. The element (e.g., [0XC3] of ROW 2 goes from horizontal in ROW 2 to vertically as the third bit of each bit-vector, the element (e.g., [0XA5]) of ROW 3 goes from horizontal in ROW 3 to vertically as the fourth bit of each bit-vector, the element (e.g., [0XF0]) of ROW 4 goes from horizontal in ROW 4 to vertically as the fifth bit of each bit-vector, the element (e.g., [0X0F]) of ROW 5 goes from horizontal in ROW 5 to vertically as the sixth bit of each bit-vector, the element (e.g., [0XC3]) of ROW 6 goes from horizontal in ROW 6 to vertically as the seventh bit of each bit-vector, and the element (e.g., [0XA5]) of ROW 7 goes from horizontal in ROW 7 to vertically as the seventh bit of each bit-vector. In this way, operations performed by a compute component can be more efficiently executed in the array of FIG. 4.

Figure 7:
FIG. 7 is a logic table illustrating selectable logic operation results implemented by a sensing circuitry in accordance with a number of embodiments of the present disclosure.

FIG. 7 is a logic table illustrating selectable logic operation results implemented by a sensing circuitry (e.g., sensing circuitry 250 shown in FIG. 2) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 206 and compute component 231. The four control signals (e.g., TF, TT, FT, and FF), in conjunction with a particular data value present on the complementary sense lines (e.g., on nodes S and S*), controls the pass gates 307-1 and 307-2 and swap transistors 342, which in turn affects the data value in the compute component 331 and/or sense amplifier 306 before/after firing. The capability to selectably control the swap transistors 342 facilitates implementing logical operations involving inverse data values (e.g., inverse operands and/or inverse result), among others.

Logic Table 7-1 illustrated in FIG. 7 shows the starting data value stored in the compute component 231 shown in column A at 744, and the starting data value stored in the sense amplifier 206 shown in column B at 745. The other 3 column headings in Logic Table 7-1 refer to the state of the pass gates 207-1 and 207-2 and the swap transistors 242, which can respectively be controlled to be OPEN or CLOSED depending on the state of the four logic selection control signals (e.g., TF, TT, FT, and FF), in conjunction with a particular data value present on the pair of complementary sense lines 205-1 and 205-2 when the ISO control signal is asserted. The "NOT OPEN" column corresponds to the pass gates 207-1 and 207-2 and the swap transistors 242 both being in a non-conducting condition, the "OPEN TRUE" column corresponds to the pass gates 207-1 and 207-2 being in a conducting condition, and the "OPEN INVERT" column corresponds to the swap transistors 242 being in a conducting condition. The configuration corresponding to the pass gates 207-1 and 207-2 and the swap transistors 242 both being in a conducting condition is not reflected in Logic Table 7-1 since this results in the sense lines being shorted together.

Via selective control of the pass gates 207-1 and 207-2 and the swap transistors 242, each of the three columns of the upper portion of Logic Table 7-1 can be combined with each of the three columns of the lower portion of Logic Table 7-1 to provide nine (e.g., 3×3) different result combinations, corresponding to nine different logical operations, as indicated by the various connecting paths shown at 775. The nine different selectable logical operations that can be implemented by the sensing circuitry 250 are summarized in Logic Table 7-2.

The columns of Logic Table 7-2 show a heading 780 that includes the states of logic selection control signals (e.g., FF, FT, TF, TT). For example, the state of a first logic selection control signal (e.g., FF) is provided in row 776, the state of a second logic selection control signal (e.g., FT) is provided in row 777, the state of a third logic selection control signal (e.g., TF) is provided in row 778, and the state of a fourth logic selection control signal (e.g., TT) is provided in row 779. The particular logical operation corresponding to the results is summarized in row 747.

FIG. 8 illustrates a timing diagram associated with performing a logical AND operation and a shifting operation using the sensing circuitry in accordance with a number of embodiments of the present disclosure. FIG. 8 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access line (e.g., access lines 204-X and 204-Y shown in FIG. 2) to access a selected cell (or row of cells). The SENSE AMP signal corresponds to a signal used to enable/disable a sense amplifier (e.g., sense amplifier 306). The TF, TT, FT, and FF signals correspond to logic selection control signals such as those shown in FIG. 3 (e.g., signals coupled to logic selection transistors 362, 3452, 354, and 364). The PHASE 1R, PHASE 2R, PHASE 1L, and PHASE 2L signals correspond to the control signals (e.g., clock signals) provided to respective control lines 382, 383, 391 and 392 shown in FIG. 3. The ISO signal corresponds to the signal coupled to the gates of the isolation transistors 350-1 and 350-2 shown in FIG. 3. The PASS signal corresponds to the signal coupled to the gates of pass transistors 307-1 and 307-2 shown in FIG. 3, and the PASS* signal corresponds to the signal coupled to the gates of the swap transistors 342. The DIGIT and DIGIT_ signals correspond to the signals present on the respective sense lines 305-1 (e.g., DIGIT (n)) and 305-2 (e.g., DIGIT (n)_).

The timing diagram shown in FIG. 8 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 8, reference will be made to the sensing circuitry described in FIG. 3. For example, the logical operation described in FIG. 8 can include storing the data value of the ROW X memory cell (e.g., the "ROW X data value) in the latch of the corresponding compute component 331 (e.g., the "A" data value), which can be referred to as the accumulator 331, storing the data value of the ROW Y memory cell (e.g., the "ROW Y data value") in the latch of the corresponding sense amplifier 306 (e.g., the "B" data value), and performing a selected logical operation (e.g., a logical AND operation in this example) on the ROW X data value and the ROW Y data value, with the result of the selected logical operation being stored in the latch of the compute component 331.

As shown in FIG. 8, at time $T_1$, equilibration of the sense amplifier 306 is disabled (e.g., EQ goes low). At time $T_2$, ROW X goes high to access (e.g., select) the ROW X memory cell. At time $T_3$, the sense amplifier 306 is enabled (e.g., SENSE AMP goes high), which drives the complementary sense lines 305-1 and 305-2 to the appropriate rail voltages (e.g., $V_{DD}$ and GND) responsive to the ROW X data value (e.g., as shown by the DIGIT and DIGIT_ signals), and the ROW X data value is latched in the sense amplifier 306. At time $T_4$, the PHASE 2R and PHASE 2L signals go low, which disables feedback on the latch of the compute component 331 (e.g., by turning off transistors 386 and 390, respectively) such that the value stored in the compute component may be overwritten during the logical operation. Also, at time $T_4$, ISO goes low, which disables isolation transistors 350-1 and 350-2. At time $T_5$, TT and FT are enabled (e.g., go high), which results in PASS going high (e.g., since either transistor 352 or 354 will conduct depending on which of node ST2 (corresponding to node "S" in FIG. 2) or node SF2 (corresponding to node "S*" in FIG. 2) was high when ISO was disabled at time $T_4$ (recall that when ISO is disabled, the voltages of the nodes ST2 and SF2 reside dynamically on the gates of the respective enable transistors 352 and 354). PASS going high enables the pass transistors 307-1 and 307-2 such that the DIGIT and DIGIT_ signals, which correspond to the ROW X data value, are provided to the respective compute component nodes ST2 and SF2. At time $T_6$, TT and FT are disabled, which results in PASS going low, which disables the pass transistors 307-1 and 307-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 331 such that the ROW X data value is latched therein. Enabling ISO at time $T_7$ again couples nodes ST2 and SF2 to the gates of the enable transistors 352, 354, 362, and 364. At time $T_8$, equilibration is enabled (e.g., EQ goes high such that DIGIT and DIGIT_ are driven to an equilibrate voltage such as $V_{DD}/2$) and the sense amplifier 306 is disabled (e.g., SENSE AMP goes low).

With the ROW X data value latched in the compute component 331, equilibration is disabled (e.g., EQ goes low at time $T_9$). At time $T_{10}$, ROW Y goes high to access (e.g., select) the ROW Y memory cell. At time $T_{11}$, the sense amplifier 306 is enabled (e.g., SENSE AMP goes high), which drives the complementary sense lines 305-1 and 305-2 to the appropriate rail voltages (e.g., $V_{DD}$ and GND) responsive to the ROW Y data value (e.g., as shown by the DIGIT and DIGIT_ signals), and the ROW Y data value is latched in the sense amplifier 306. At time $T_{12}$, the PHASE 2R and PHASE 2L signals go low, which disables feedback on the latch of the compute component 331 (e.g., by turning off transistors 386 and 390, respectively) such that the value stored in the compute component may be overwritten during the logical operation. Also, at time $T_{12}$, ISO goes low, which disables isolation transistors 350-1 and 350-2. Since the desired logical operation in this example is an AND operation, at time $T_{13}$, TT is enabled while TF, FT and FF remain disabled (as shown in TABLE 7-2, FF=0, FT=0, TF=0, and TT=1 corresponds to a logical AND operation). Whether enabling TT results in PASS going high depends on the value stored in the compute component 331 when ISO is disabled at time $T_{12}$. For example, enable transistor 352 will conduct if node ST2 was high when ISO is disabled, and enable transistor will not conduct if node ST2 was low when ISO was disabled at time $T_{12}$.

In this example, if PASS goes high at time $T_{13}$, the pass transistors 307-1 and 307-2 are enabled such that the DIGIT and DIGIT_ signals, which correspond to the ROW Y data value, are provided to the respective compute component nodes ST2 and SF2. As such, the value stored in the compute component 331 (e.g., the ROW X data value) may be flipped, depending on the value of DIGIT and DIGIT_ (e.g., the ROW Y data value). In this example, if PASS stays low at time $T_{13}$, the pass transistors 307-1 and 307-2 are not enabled such that the DIGIT and DIGIT_ signals, which correspond to the ROW Y data value, remain isolated from the nodes ST2 and SF2 of the compute component 331. As such, the data value in the compute component (e.g., the ROW X data value) would remain the same.

At time $T_{14}$, TT is disabled, which results in PASS going (or remaining) low, such that the pass transistors 307-1 and 307-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 331 such that the result of the AND operation (e.g., "A" AND "B") is latched therein. Enabling ISO at time $T_{15}$ again couples nodes ST2 and SF2 to the gates of the enable transistors 352, 354, 362, and 364. At time $T_{16}$, equilibration is enabled (e.g., EQ goes high such that DIGIT and DIGIT_ are driven to an equilibrate voltage) and the sense amplifier 306 is disabled (e.g., SENSE AMP goes low).

The result of the AND operation, which is initially stored in the compute component 331 in this example, can be transferred back to the memory array (e.g., to a memory cell coupled to ROW X, ROW Y, and/or a different row via the complementary sense lines) and/or to an external location (e.g., an external processing component) via I/O lines.

FIG. 8 also includes (e.g., at 801) signaling associated with shifting data (e.g., from a compute component 331 to an adjacent compute component 331). The example shown in FIG. 8 illustrates two left shifts such that a data value stored in a compute component corresponding to column "N" is shifted left to a compute component corresponding to column "N-2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 389 to conduct, which causes the data value at node SF1 to move left to node SF2 of a left-adjacent compute component 331. PHASE 2L is subsequently enabled at time $T_{19}$ and disabled at time $T_{20}$. Enabling PHASE 2L causes transistor 390 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

FIG. 9 illustrates a timing diagram associated with performing a logical XOR operation and a shifting operation using the sensing circuitry in accordance with a number of embodiments of the present disclosure. FIG. 9 includes the same waveforms described in FIG. 8 above. However, the timing diagram shown in FIG. 9 is associated with performing a logical XOR operation on a ROW X data value and a ROW Y data value (e.g., as opposed to a logical AND operation). Reference will again be made to the sensing circuitry described in FIG. 3.

The signaling indicated at times $T_0$ through $T_9$ for FIG. 9 are the same as for FIG. 8 and will not be repeated here. As such, at time $T_9$, EQ is disabled with the ROW X data value being latched in the compute component 331. At time $T_{10}$, ROW Y goes high to access (e.g., select) the ROW Y memory cell. At time $T_{11}$, the sense amplifier 306 is enabled (e.g., SENSE AMP goes high), which drives the complementary sense lines 305-1 and 305-2 to the appropriate rail voltages (e.g., $V_{DD}$ and GND) responsive to the ROW Y data value (e.g., as shown by the DIGIT and DIGIT_ signals), and the ROW Y data value is latched in the sense amplifier 306. At time $T_{12}$, the PHASE 2R and PHASE 2L signals go low, which disables feedback on the latch of the compute component 1431 (e.g., by turning off transistors 386 and 390, respectively) such that the value stored in the compute component 331 may be overwritten during the logical operation. Also, at time $T_{12}$, ISO goes low, which disables isolation transistors 350-1 and 350-2. Since the desired logical operation in this example is an XOR operation, at time $T_{13}$, TF and FT are enabled while TT and FF remain disabled (as shown in TABLE 7-2, FF=0, FT=1, TF=1, and TT=0 corresponds to a logical XOR (e.g., "AXB") operation). Whether enabling TF and FT results in PASS or PASS* going high depends on the value stored in the compute component 331 when ISO is disabled at time $T_{12}$. For example, enable transistor 362 will conduct if node ST2 was high when ISO is disabled, and enable transistor 362 will not conduct if node ST2 was low when ISO was disabled at time $T_{12}$. Similarly, enable transistor 354 will conduct if node SF2 was high when ISO is disabled, and enable transistor 354 will not conduct if node SF2 was low when ISO is disabled.

In this example, if PASS goes high at time $T_{13}$, the pass transistors 307-1 and 307-2 are enabled such that the DIGIT and DIGIT_ signals, which correspond to the ROW Y data value, are provided to the respective compute component nodes ST2 and SF2. As such, the value stored in the compute component 331 (e.g., the ROW X data value) may be flipped, depending on the value of DIGIT and DIGIT_ (e.g., the ROW Y data value). In this example, if PASS stays low at time $T_{13}$, the pass transistors 307-1 and 307-2 are not enabled such that the DIGIT and DIGIT_ signals, which correspond to the ROW Y data value, remain isolated from the nodes ST2 and SF2 of the compute component 331. As such, the data value in the compute component (e.g., the ROW X data value) would remain the same. In this example, if PASS* goes high at time $T_{13}$, the swap transistors 342 are enabled such that the DIGIT and DIGIT_ signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_ would be provided to node ST2). As such, the value stored in the compute component 331 (e.g., the ROW X data value) may be flipped, depending on the value of DIGIT and DIGIT_ (e.g., the ROW Y data value). In this example, if PASS* stays low at time $T_{13}$, the swap transistors 342 are not enabled such that the DIGIT and DIGIT_ signals, which correspond to the ROW Y data value, remain isolated from the nodes ST2 and SF2 of the compute component 331. As such, the data value in the compute component (e.g., the ROW X data value) would remain the same.

At time $T_{14}$, TF and FT are disabled, which results in PASS and PASS* going (or remaining) low, such that the pass transistors 307-1 and 307-2 and swap transistors 342 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 331 such that the result of the XOR operation (e.g., "A" XOR "B") is latched therein. Enabling ISO at time $T_{15}$ again couples nodes ST2 and SF2 to the gates of the enable transistors 352, 354, 362, and 364. At time $T_{16}$, equilibration is enabled (e.g., EQ goes high such that DIGIT and DIGIT_ are driven to an equilibrate voltage) and the sense amplifier 306 is disabled (e.g., SENSE AMP goes low).

The result of the XOR operation, which is initially stored in the compute component 331 in this example, can be transferred back to the memory array (e.g., to a memory cell coupled to ROW X, ROW Y, and/or a different row via the complementary sense lines) and/or to an external location (e.g., an external processing component) via I/O lines.

FIG. 9 also includes (e.g., at 901) signaling associated with shifting data (e.g., from a compute component 331 to an adjacent compute component 331). The example shown in FIG. 9 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 381 to conduct, which causes the data value at node ST1 to move right to node ST2 of a right-adjacent compute component 331. PHASE 2R is subsequently enabled at time $T_{19}$ and disabled at time $T_{20}$. Enabling PHASE 2R causes transistor 386 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 8 and 9 include the logical operation result being stored in the compute component (e.g., 331), sensing circuitry in accordance with embodiments described herein can be operated to perform logical operations with the result being initially stored in the sense amplifier (e.g., as illustrated in FIG. 8). Also, embodiments are not limited to the "AND" and "XOR" logical operation examples described in FIGS. 8 and 9, respectively. For example, sensing circuitry in accordance with embodiments of the present disclosure (e.g., 350 shown in FIG. 3) can be controlled to perform various other logical operations such as those shown in Table 7-2.

While example embodiments including various combinations and configurations of sensing circuitry, sense amps, compute components, dynamic latches, isolation devices, and/or shift circuitry have been illustrated and described herein, embodiments of the present disclosure are not limited to those combinations explicitly recited herein. Other combinations and configurations of the sensing circuitry, sense amps, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
    a first group of memory cells coupled to a particular access line and to a plurality of sense lines;
    a second group of memory cells coupled to a plurality of access lines and to one of the plurality of sense lines, wherein the particular access line is one of the plurality of access lines; and
    a controller configured to cause a corner turn operation to be performed on an element stored in the first group of memory cells such that the corner turn operation results in the element being stored in the second group of memory cells;
    wherein the controller is configured to cause performance of the corner turn operation by controlling sensing circuitry coupled to the plurality of sense lines to perform a plurality of logical operations using data units corresponding to the element as inputs.

2. The apparatus of claim 1, wherein the plurality of logical operations comprises at least one of:
    a number of AND operations;
    a number of OR operations; and
    a number of XOR operations.

3. The apparatus of claim 2, wherein the controller is configured to cause performance of the corner turn operation by performing the plurality of logical operations without transferring data external to the sensing circuitry.

4. The apparatus of claim 2, wherein the controller is further configured to cause performance of the corner turn operation by controlling the sensing circuitry to perform a plurality of shift operations on bit-vectors stored in the sensing circuitry.

5. The apparatus of claim 1, wherein the apparatus comprises a memory device coupled to an external processor, and therein the controller is located on the memory device and is configured to perform the corner turn operation without transferring data to the external processor via a bus.

6. The apparatus of claim 1, wherein the sensing circuitry comprises a plurality of sense amplifier and compute component pairs each pair corresponding to one of a respective plurality of columns of an array comprising the first and second groups of memory cells.

7. The apparatus of claim 1, wherein the element comprises a bit-vector.

8. A method for performing a corner turn, comprising:
    performing, in parallel, a plurality of corner turn operations, using a controller to control sensing circuitry, to relocate elements stored in a first format in memory cells coupled to a plurality of access lines and to a plurality of sense lines of a memory array to being stored in a second format in the memory cells,
    wherein performing the plurality of corner turn operations comprises:
        accessing an element stored in the first format in memory cells coupled to one of the plurality of access lines and the plurality of sense lines;
        relocating the element in the second format in memory cells coupled to one of the plurality of sense lines and the plurality of access lines; and
        performing a number of logical operations.

9. The method of claim 8, wherein performing the number of logical operations comprises performing at least one of:
    a number of AND operations;
    a number of OR operations; and
    a number of XOR operations.

10. The method of claim 8, wherein the method includes:
    storing a first of the elements in a first group of memory cells coupled to the first of the plurality of access lines and to the plurality of sense lines when in the first format; and
    storing the first element in a second group of memory cells coupled to the plurality of access lines and a first of the plurality of sense lines when in the second format.

11. The method of claim 8, wherein, when in the first format, storing a data unit of each of the elements having a same significance in memory cells coupled to a same sense line.

12. The method of claim 11, wherein, when in the second format, storing a data unit of each of the elements having a same significance in memory cells coupled to a same access line.

13. A system, comprising:
    a host configured to generate instructions; and
    a memory device configured to execute instructions from the host to perform a corner turn operation, in parallel, on a first element stored in a first group of memory cells coupled to a first access line and to a plurality of first sense lines and on a second element stored in a second group of memory cells coupled to a second access line and to a plurality of second sense lines such that, subsequent to the corner turn:
        the first element is stored in memory cells coupled to one of the plurality of first sense lines and a plurality of first access lines that includes the first access line; and
        the second element is stored in memory cells coupled to one of the plurality of second sense lines and the plurality first access lines that includes the first access line; and
    wherein the corner turn operation is performed by the memory device using sensing circuitry to perform a number of logical operations.

14. The system of claim 13, wherein the host comprises a processing resource configured to generate the instructions.

15. The system of claim 14, wherein the processing resource comprises one of:
    a host processor; and
    a controller.

16. The system of claim 13, wherein the memory device is configured to perform logical operations on the first and second elements and provide results of the logical operation to the host via a bus.

17. The system of claim 13, wherein the memory device comprises control circuitry configured to execute instructions received from the host.

18. The system of claim 17, wherein the control circuitry comprises at least one of:
   a sequencer; and
   a state machine.

19. The system of claim 13, wherein the host and the memory device are on a same integrated circuit.

20. The system of claim 13, wherein the number of logical operations comprise at least one of:
   a number of AND operations;
   a number of OR operations; and
   a number of XOR operations.

* * * * *